(12) United States Patent
Eom et al.

(10) Patent No.: US 8,860,196 B2
(45) Date of Patent: Oct. 14, 2014

(54) SEMICONDUCTOR PACKAGE AND METHOD OF FABRICATING THE SAME

(75) Inventors: Joo-yang Eom, Bucheon (KR); Joon-seo Son, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 0 days.

(21) Appl. No.: 13/342,372

(22) Filed: Jan. 3, 2012

(65) Prior Publication Data

US 2012/0168919 A1    Jul. 5, 2012

(30) Foreign Application Priority Data

Jan. 4, 2011  (KR) ........................ 10-2011-0000553

(51) Int. Cl.
| | |
|---|---|
| *H01L 23/20* | (2006.01) |
| *H01L 23/433* | (2006.01) |
| *H01L 23/498* | (2006.01) |
| *H01L 23/31* | (2006.01) |
| *H01L 25/065* | (2006.01) |
| *H01L 23/373* | (2006.01) |
| *H01L 21/56* | (2006.01) |
| *H01L 23/00* | (2006.01) |

(52) U.S. Cl.
CPC ... *H01L 23/3735* (2013.01); *H01L 2224/48137* (2013.01); *H01L 2224/45014* (2013.01); *H01L 2924/13091* (2013.01); *H01L 21/56* (2013.01); *H01L 23/4334* (2013.01); *H01L 23/562* (2013.01); *H01L 24/73* (2013.01); *H01L 23/49811* (2013.01); *H01L 2224/40247* (2013.01); *H01L 2224/73221* (2013.01); *H01L 2924/13055* (2013.01); *H01L 24/34* (2013.01); *H01L 23/3121* (2013.01); *H01L 2224/48247* (2013.01); *H01L 2224/40137* (2013.01); *H01L 25/0655* (2013.01)
USPC ........... 257/678; 257/677; 257/679; 257/680; 257/E23.01; 438/675

(58) Field of Classification Search
USPC .......................... 257/124, 678–686; 438/675
See application file for complete search history.

(56) References Cited

U.S. PATENT DOCUMENTS

| | | | |
|---|---|---|---|
| 6,206,997 | B1 | 3/2001 | Egitto et al. |
| 6,750,082 | B2 | 6/2004 | Briar et al. |
| 6,999,318 | B2 | 2/2006 | Newby |
| 8,058,659 | B2 * | 11/2011 | Bisberg ........................... 257/88 |
| 8,237,252 | B2 * | 8/2012 | Pagaila et al. ................. 257/686 |

* cited by examiner

*Primary Examiner* — Elias M Ullah
(74) *Attorney, Agent, or Firm* — Okamoto & Benedicto LLP

(57) ABSTRACT

A semiconductor package and a method of manufacturing the same, and more particularly, to a package of a power module semiconductor and a method of manufacturing the same. The semiconductor package includes a substrate including a plurality of conductive patterns spaced apart from one another; a plurality of semiconductor chips disposed on the conductive patterns; a connecting member for electrically connecting the conductive patterns to each other, for electrically connecting the semiconductor chips to each other, or for electrically connecting the conductive pattern and the semiconductor chip; and a sealing member for covering the substrate, the semiconductor chips, and the connecting member, wherein a lower surface of the substrate and an upper surface of the connecting member are exposed to the outside by the sealing member.

18 Claims, 19 Drawing Sheets

SEMICONDUCTOR PACKAGE AND METHOD OF FABRICATING THE SAME

CROSS-REFERENCE TO RELATED PATENT APPLICATION

This application claims the benefit of Korean Patent Application No. 10-2011-0000553, filed on Jan. 4, 2011, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same, and more particularly, to a power module semiconductor package and a method of manufacturing the same.

2. Description of the Related Art

Recently, as speeds and capacities of electronic apparatuses have been increased and as sizes thereof have been decreased, semiconductor packages having a structure capable of effectively discharging generated heat and a method of manufacturing the semiconductor packages are required.

SUMMARY OF THE INVENTION

The present invention provides a semiconductor package capable of effectively discharging generated heat.

The present invention also provides a method of manufacturing the semiconductor package capable of effectively discharging generated heat.

According to an aspect of the present invention, there is provided a semiconductor package including: a substrate comprising a plurality of conductive patterns spaced apart from one another; a plurality of semiconductor chips disposed on the conductive patterns; a connecting member for electrically connecting the conductive patterns to each other, for electrically connecting the semiconductor chips to each other, or for electrically connecting the conductive pattern and the semiconductor chip to each other; and a sealing member for covering the substrate, the semiconductor chips, and the connecting member, wherein a lower surface of the substrate and an upper surface of the connecting member are exposed to the outside by the sealing member.

In some embodiments of the present invention, the connecting member may include a bonding clip.

In some embodiments of the present invention, the connecting member may include a bonding ribbon.

In some embodiments of the present invention, the substrate may be a direct bonding copper (DBC) substrate including a ceramic insulating film, an upper conductive pattern disposed on the ceramic insulating film, and a lower conductive pattern disposed under the ceramic insulating film.

In some embodiments of the present invention, the conductive patterns spaced apart from one another may be the upper conductive patterns.

In some embodiments of the present invention, the substrate may include an insulated metal substrate (IMS).

In some embodiments of the present invention, the substrate may include a metalizing ceramic substrate.

In some embodiments of the present invention, the substrate may include a lead frame.

In some embodiments of the present invention, the upper surface of the connecting member exposed to the outside by the sealing member may be electrically connected to the outside of the semiconductor package.

In some embodiments of the present invention, the outside of the semiconductor package may be a printed circuit board (PCB).

In some embodiments of the present invention, the upper surface of the connecting member exposed to the outside by the sealing member and the PCB may be electrically connected to each other via a soldering member.

In some embodiments of the present invention, the upper surface of the connecting member exposed to the outside by the sealing member may be treated by a plating process.

In some embodiments of the present invention, the semiconductor package may further include a heat sink contacting the lower surface of the substrate exposed to the outside by the sealing member.

In some embodiments of the present invention, the semiconductor package may further include a metal slug disposed on the substrate, wherein an upper surface of the metal slug may be exposed by the sealing member.

In some embodiments of the present invention, the upper surface of the metal slug may be treated by a plating process.

In some embodiments of the present invention, the semiconductor package may further include a bonding wire for electrically connecting the conductive patterns to each other, for electrically connecting the semiconductor chips to each other, or for electrically connecting the conductive pattern and the semiconductor chip.

According to another aspect of the present invention, there is provided a method of manufacturing a semiconductor package, the method including: preparing a substrate comprising a plurality of conductive patterns spaced apart from one another; disposing a plurality of semiconductor chips disposed on the conductive patterns; electrically connecting the conductive patterns to each other, the semiconductor chips to each other, or the conductive pattern and the semiconductor chip to each other, by using a connecting member; and forming a sealing member for covering the substrate, the semiconductor chips, and the connecting member, wherein the forming of the sealing member comprises exposing a lower surface of the substrate and an upper surface of the connecting member to the outside.

In some embodiments of the present invention, the forming of the sealing member may include: forming a first sealing member so as to cover the entire connecting member; and grinding an upper surface of the first sealing member until an upper surface of the connecting member is exposed.

In some embodiments of the present invention, the forming of the sealing member may include forming the sealing member so as to expose the upper surface of the connecting member without performing the grinding process.

In some embodiments of the present invention, the method may further include performing a plating process on the upper surface of the connecting member exposed by the sealing member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1A:
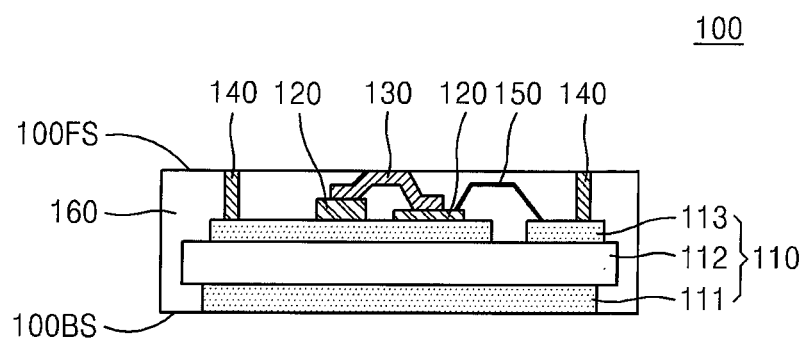
FIG. 1A is a cross-sectional view of a semiconductor package according to an embodiment of the present invention.

The present inventive concept will be described more fully with reference to the accompanying drawings.

The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "below" or "lower" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

A semiconductor package to be described in the present application may be a solder mask defined-type semiconductor package.

Figure 1B:
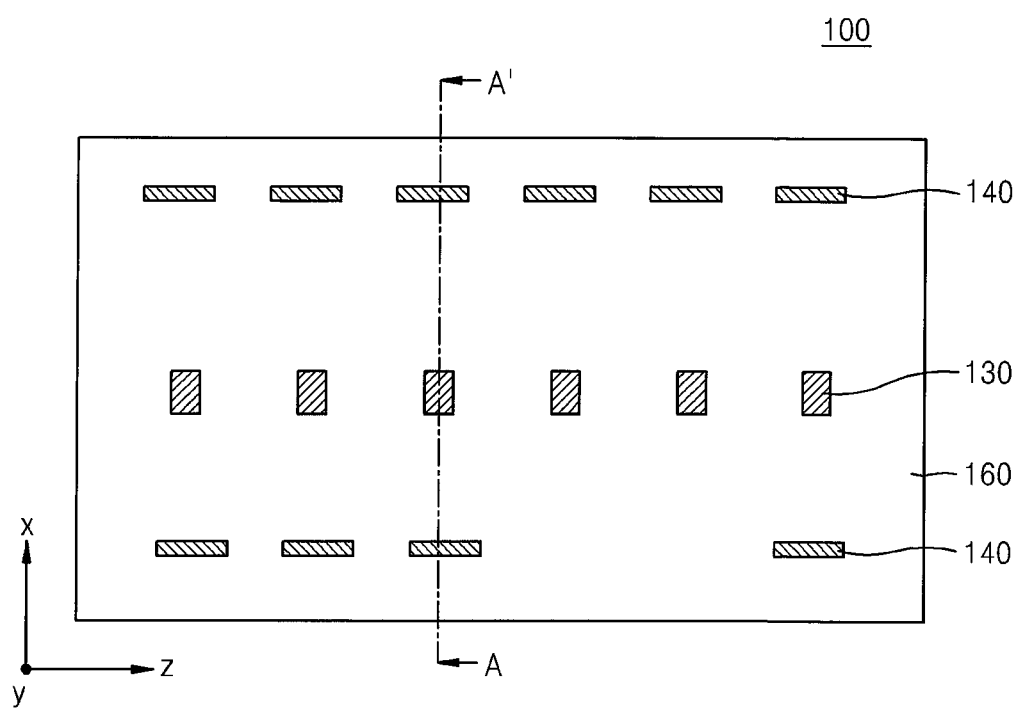
FIG. 1B is a top view of the semiconductor package of FIG. 1A.
Figure 1C:
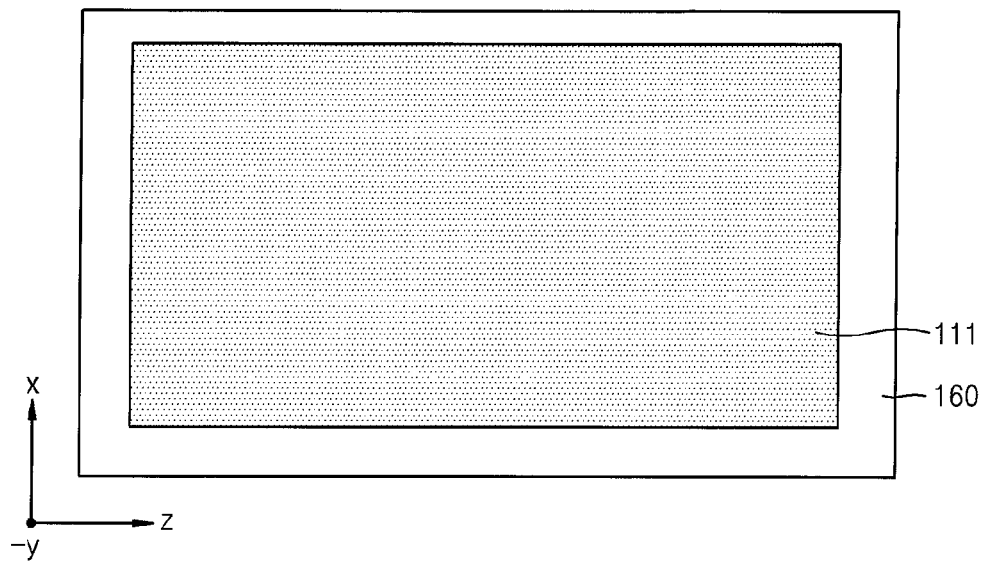
FIG. 1C is a bottom view of the semiconductor package of FIG. 1A.
Figure 1D:
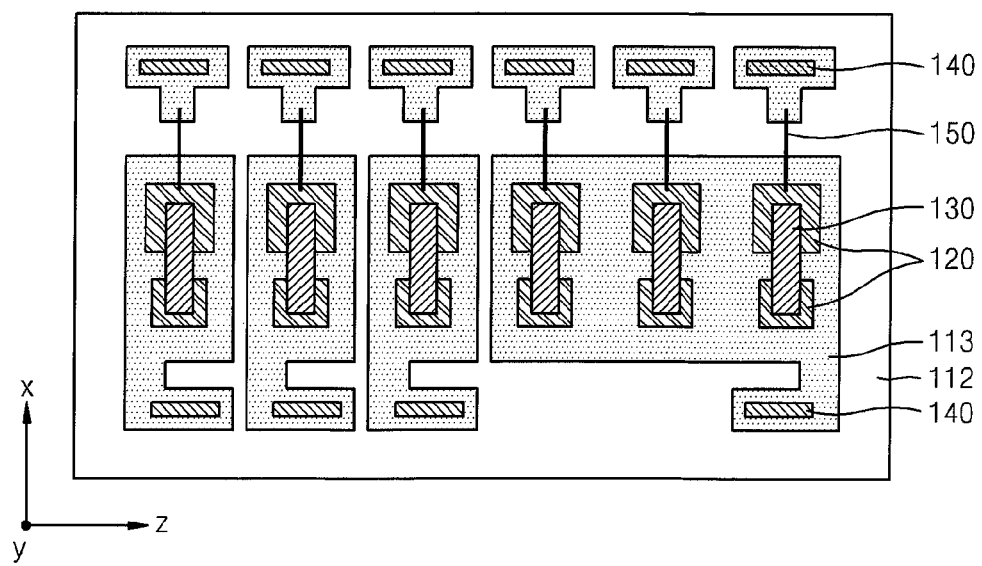
FIG. 1D is a top view of the semiconductor package of FIG. 1B that does not include a sealing member.

FIG. 1A is a cross-sectional view of a semiconductor package 100 according to an embodiment of the present invention. FIG. 1B is a top view of the semiconductor package 100 of FIG. 1A. FIG. 1C is a bottom view of the semiconductor package 100 of FIG. 1A. FIG. 1A illustrates the semiconductor package 100 taken along a line A-A' of FIG. 1B. FIG. 1D is a top view of the semiconductor package 100 of FIG. 1B that does not include a sealing member 160 to easily understand a structure of the semiconductor package 100 of FIG. 1A.

In FIG. 1A, an X-axis is a horizontal direction, a Y-axis is a vertical direction, and a Z-axis points towards an observer, which also applies to all the coordinate axes of all figures.

Referring to FIGS. 1A through 1D, the semiconductor package 100 includes a substrate 110 including a plurality of conductive patterns 113 that are spaced apart from each other.

First, a case where the substrate 110 is a direct bonded copper (DBC) substrate will now be described. The DBC substrate 110 may include a ceramic insulating film 112, a plurality of upper conductive patterns 113 disposed on the ceramic insulating film 112, and a lower conductive pattern 111 disposed under the ceramic insulating film 112. That is, the plurality of conductive patterns 113 of the substrate 110 that are spaced apart from each other correspond to the upper conductive patterns 113 of the DBC substrate 110. The lower conductive pattern 111 and the upper conductive pattern 113 of the DBC substrate 110 may each be formed of a copper layer. The DBC substrate 110 may be formed by respectively compressing the lower conductive pattern 111 and the upper conductive pattern 113 each formed of a copper layer on both surfaces of the ceramic insulating film 112.

A plurality of semiconductor chips 120 are disposed on each conductive pattern 113. A semiconductor chip 120 may include a power device and/or a control device. The power device may be used in a motor drive, a power-inverter, a power-converter, a power factor correction (PFC), or a display drive. However, the present invention is not limited thereto. Alternatively, the semiconductor chip 120 may include an active device. For example, the active device may include any device selected from the group consisting of a metal-oxide semiconductor field effect transistor (MOS-FET), an insulated gate bi-polar transistor (IGBT), and a diode, or a combination thereof. Although a plurality of the semiconductor chips 120 are illustrated in FIG. 1A, only a single semiconductor chip 120 may be disposed on the conductive pattern 113.

The semiconductor chips 120 are electrically connected to each other via a connecting member 130. The connecting member 130 may be any one selected from the group consisting of a bonding clip and a bonding ribbon, or a combination thereof. Although FIG. 1A illustrates the semiconductor chips 120 electrically connected to each other via the connecting member 130, another connecting member may be selectively or additionally formed to electrically connect the conductive patterns 113 and/or to electrically connect the conductive pattern 113 and the semiconductor chips 120. The connecting member 130 may have a shape in which a level of a center portion thereof is higher than both end portions, and the center portion of the connecting member 130 may have an area having a constant level. This shape of the connecting member 130 may be easily realized when the connecting member 130 is a bonding clip.

The sealing member 160 covers the substrate 110, the semiconductor chips 120, and the connecting member 130. The sealing member 160 seals the semiconductor chips 120 and does not completely seal the semiconductor chips 120. The sealing member 160 may be formed of, for example, an epoxy mold compound (EMC). A lower portion of the substrate 110, for example, a lower portion of the lower conductive pattern 111, and a part of an upper portion of the connecting member 130, for example, the center portion of the connecting member 130, are exposed to the outside by the sealing member 160. A lower portion of the sealing member 160 and the lower portion of the substrate 110 may be coplanar, thereby forming a lower surface 100BS of the semiconductor package 100. Also, an upper surface of the sealing member 160 and the upper surface of the connecting member 130 may be coplanar, thereby forming an upper surface 100FS of the semiconductor package 100.

Heat generated from the semiconductor chip 120 may be effectively dissipated to the outside through the upper surface of the connecting member 130 and the lower portion of the substrate 110 that are exposed by the sealing member 160.

That is, in the semiconductor package 100, heat generated from the semiconductor chip 120 may be effectively dissipated to the outside through the upper surface 100FS and the lower surface 100BS of the semiconductor package 100. Also, the semiconductor chip 120 may be electrically connected to the outside of the semiconductor package 100 through the upper surface of the connecting member 130 that is exposed by the sealing member 160.

In addition, a metal slug 140 may be formed on the substrate 110, that is, on the conductive pattern 113. An upper surface of the metal slug 140 may be exposed by the sealing member 160, and the upper surface of the sealing member 160 and the upper surface of the metal slug 140 may be coplanar, thereby forming the upper surface 100FS of the semiconductor package 100. The conductive pattern 113 may be electrically connected to the outside of the semiconductor package 100 through the upper surface of the metal slug 140 that is exposed by the sealing member 160.

In addition, the semiconductor chip 120 and the conductive pattern 113 may be electrically connected via a bonding wire 150. Furthermore, a bonding wire for electrically connecting the conductive patterns 113 to each other and/or for electrically connecting semiconductor chips 120 to each other may be selectively or additionally used. The bonding wire 150 may be completely sealed by the sealing member 160.

FIG. 1A illustrates a case where the substrate 10 is a DBC substrate, which is an insulated substrate. The substrate 10 may be any one of other insulated substrates, for example, an insulated metal substrate (IMS) or a metalizing ceramic substrate.

The IMS may be formed by forming a polymer insulated substrate on an aluminum substrate and then forming a copper layer on the polymer insulated substrate according to a designed pattern. For convenience of description, the aluminum substrate may be the lower conductive pattern 111 of the IMS, the polymer insulated substrate may be the ceramic insulating film 112 of the IMS, and the copper layer of the IMS ma be the upper conductive pattern 113.

The metalizing ceramic substrate may be formed of a metal layer formed on an exposed surface of a ceramic insulated layer by brazing, plating, sputtering, or the like. For convenience of description, the ceramic insulated layer of the metalizing ceramic substrate may be the ceramic insulating film 112, and the metal layer of the metalizing ceramic substrate may be the lower conductive pattern 111 or the upper conductive pattern 113.

Figure 1E:
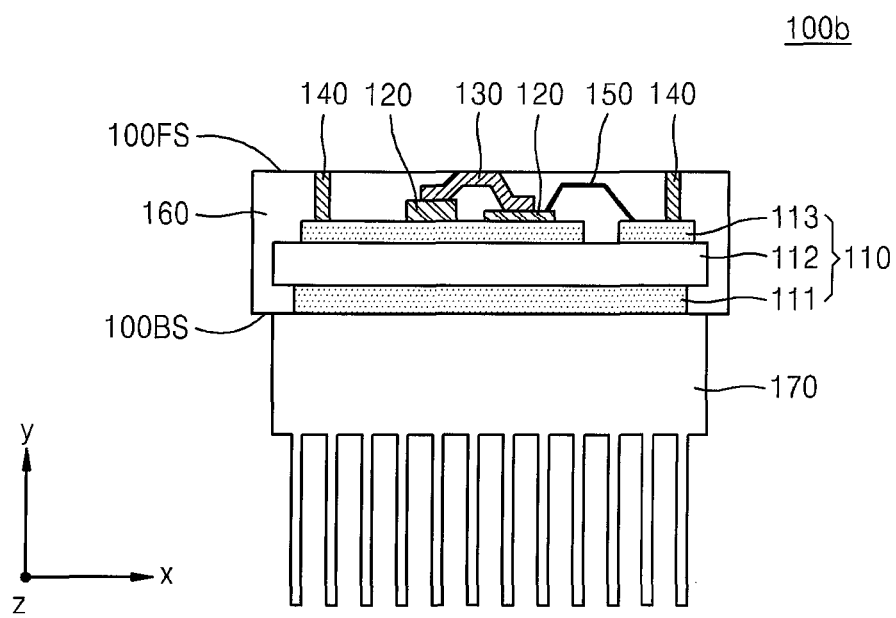
FIG. 1E is a cross-sectional view illustrating a semiconductor package according to another embodiment of the present invention.

FIG. 1E is a cross-sectional view of a semiconductor package 100b according to another embodiment of the present invention. In FIG. 1E, the same reference numerals as in FIG. 1A denote the same components, and thus, repeated descriptions with respect to FIG. 1A are omitted.

Referring to FIG. 1E, as compared to the semiconductor package 100a of FIG. 1A, the semiconductor package 100b includes a heat sink 170. The heat sink 170 is attached onto a lower surface 100BS of the semiconductor package 100b, in detail, onto a lower surface of the substrate 110 exposed by the sealing member 160. Accordingly, heat generated from the semiconductor chip 120 is rapidly dissipated to the heat sink 170 through the lower surface of the substrate 110, that is, through the lower surface of the lower conductive pattern 111. The heat sink 170 may be attached to the lower surface of the sealing member 160 and the lower surface of the substrate 110 by a contact layer and/or a mechanical coupling structure.

Figure 1F:
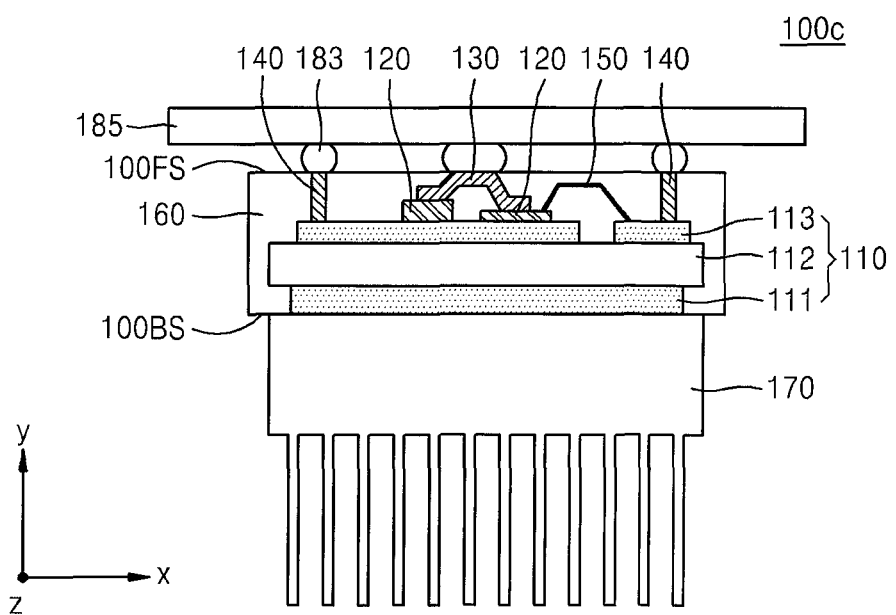
FIG. 1F is a cross-sectional view illustrating a semiconductor package according to another embodiment of the present invention.

FIG. 1F is a cross-sectional view of a semiconductor package 100c according to another embodiment of the present invention. In FIG. 1F, the same reference numerals as in FIGS. 1A and 1E denote the same components, and thus, repeated descriptions with respect to FIGS. 1A and 1E are omitted.

Referring to FIG. 1F, the upper surface of the connecting member 130 exposed by the sealing member 160 is electrically connected to the outside of the semiconductor package 100c. The outside of the semiconductor package 100c may be a printed circuit board (PCB) 185. The upper surface of the connecting member 130 exposed by the sealing member 160 and the PCB 185 may be electrically connected to each other by a soldering member 183 interposed therebetween.

Also, the upper surface of the metal slug 140 exposed by the sealing member 160 is electrically connected to the outside of the semiconductor package 100c. The outside of the semiconductor package 100c may be the PCB 185. The upper surface of the metal slug 140 exposed by the sealing member 160 and the PCB 185 may be electrically connected to each other by the soldering member 183 interposed therebetween.

In order to improve a performance of the soldering member 183, a plating process may be performed on the upper surface of the connecting member 130 and/or the upper surface of the metal slug 140. A plating metal layer may be formed on the upper surface of the connecting member 130 and/or the upper surface of the metal slug 140 by the plating process. The plating metal layer may be formed of zinc (Sn), nickel/gold (Ni/Au), or nickel/palladium/gold (Ni/Pd/Au).

Figure 2A:
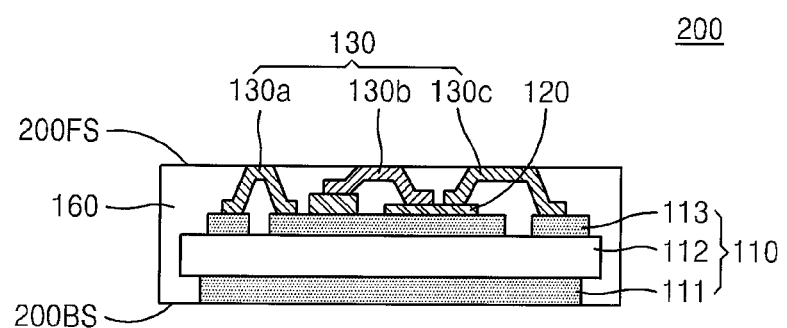
FIG. 2A is a cross-sectional view of a semiconductor package according to another embodiment of the present invention.
Figure 2B:
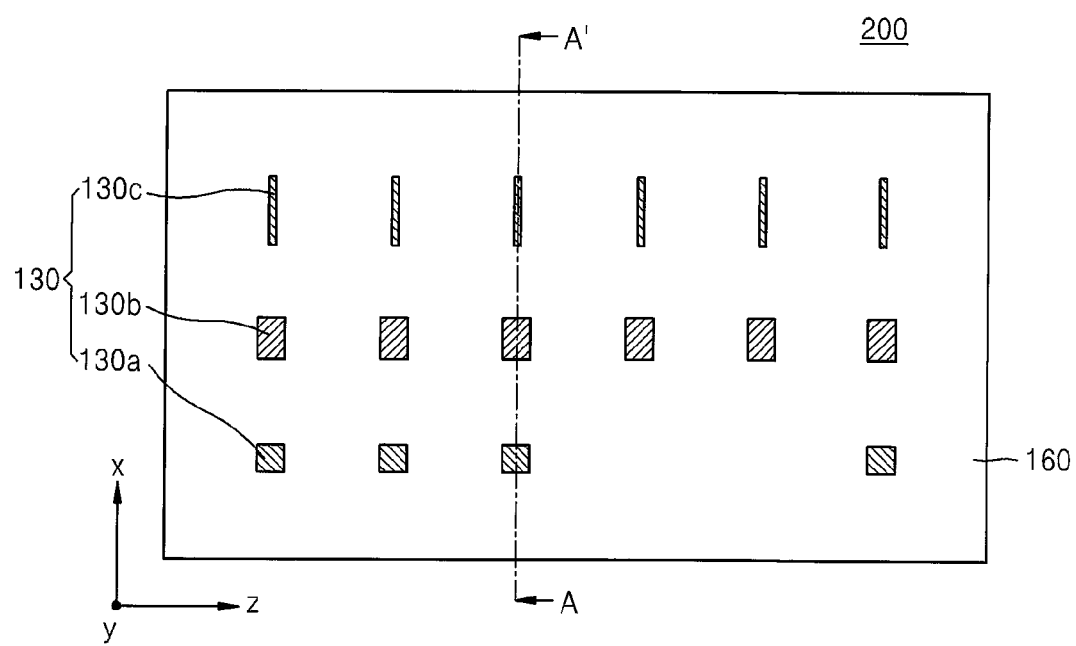
FIG. 2B is a top view of the semiconductor package of FIG. 2A.
Figure 2C:
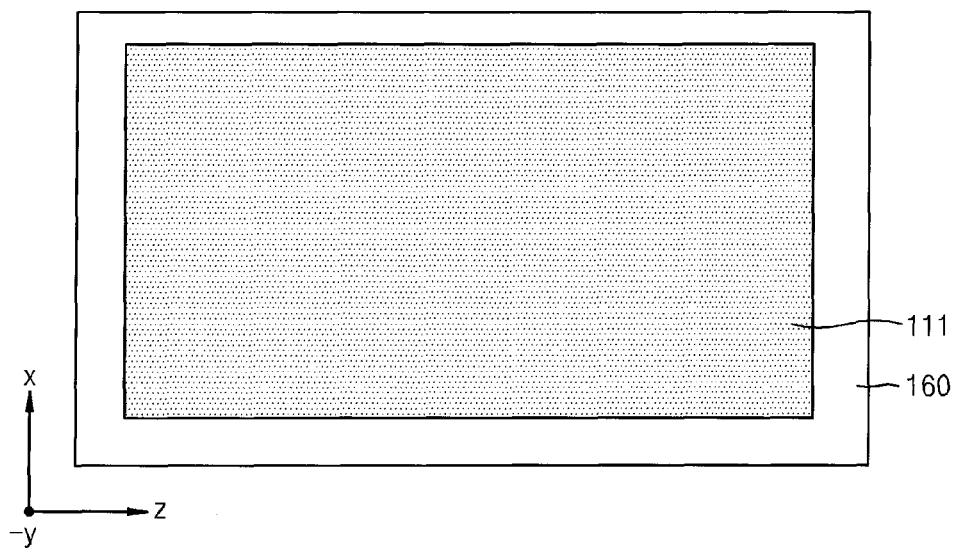
FIG. 2C is a bottom view of the semiconductor package of FIG. 2A.
Figure 2D:
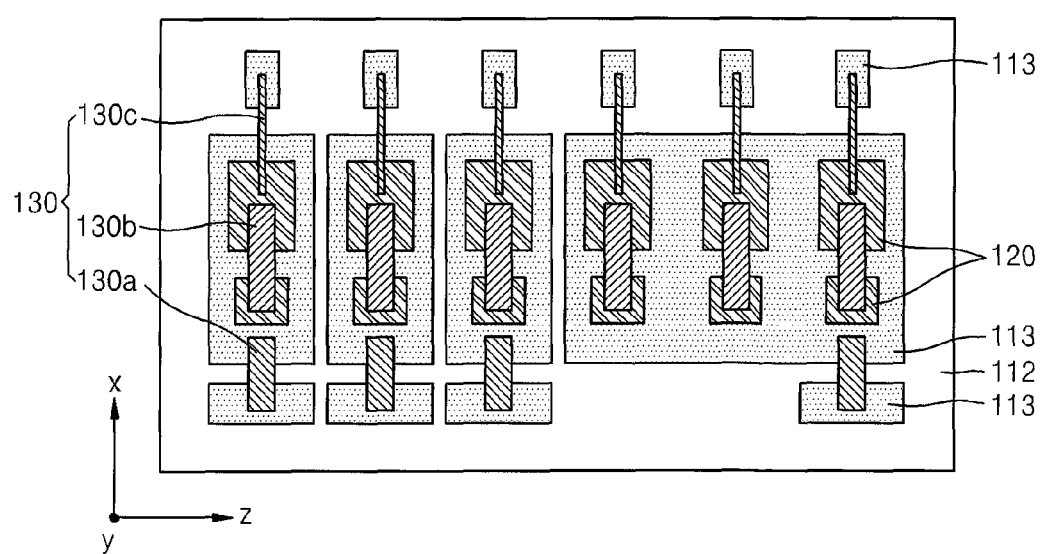
FIG. 2D is a top view of the semiconductor package of FIG. 2B that does not include a sealing member.

FIG. 2A is a cross-sectional view of a semiconductor package 200 according to another embodiment of the present invention. FIG. 2B is a top view of the semiconductor package 200 of FIG. 2A. FIG. 2C is a bottom view of the semiconductor package of FIG. 2A. FIG. 2A illustrates the semiconductor package 200 taken along a line A-A' of FIG. 2B. FIG. 2D is a top view of the semiconductor package 200 of FIG. 2B that does not include a sealing member to easily understand a structure of the semiconductor package 200 of FIG. 2A.

In FIGS. 2A through 2D, the same reference numerals as in FIGS. 1A through 1D denote the same components, and thus, repeated descriptions with respect to FIGS. 1A *through* 1D are omitted.

Referring to FIGS. 2A through 2D, the conductive patterns 113 of the substrate 110 may be electrically connected to each other via a first connecting member 130a, the semiconductor chips 120 may be electrically connected to each other via a second connecting member 130b, and the conductive pattern 113 of the substrate 110 and the semiconductor chip 120 may be electrically connected to each other via a third connecting member 130c. That is, electrical connection of the semiconductor package 200 may be performed without using the metal slug 140 and the bonding wire 150 illustrated in FIG. 1A.

The lower surface of the substrate 110, for example, the lower surface of the lower conductive pattern 111, and a part of an upper surface of a connecting member 130, for example, a center portion of the upper surface of the connecting member 130, are exposed to the outside by the sealing member 160. The lower surface of the sealing member 160 and the lower surface of the substrate 110 may be coplanar, thereby forming a lower surface 200BS of the semiconductor package 200. Also, the upper surface of the sealing member 160 and the upper surface of the connecting member 130 may be coplanar, thereby forming an upper surface 200FS of the semiconductor package 200.

Heat generated from the semiconductor chip 120 may be effectively dissipated to the outside through the upper surface of the connecting member 130 and the lower surface of the substrate 110 that are exposed by the sealing member 160.

That is, in the semiconductor package 200, heat generated from the semiconductor chip 120 may be effectively dissipated to the outside through the upper surface 200FS and the lower surface 200BS of the semiconductor package 200. Also, the semiconductor chip 120 may be electrically connected to the outside of the semiconductor package 200 through the upper surface of the connecting member 130 that is exposed by the sealing member 160. For example, as illustrated in FIG. 1F, the upper surface of the connecting member 130 that is exposed to the outside by the sealing member 160 may be electrically connected to the PCB 185 via the soldering member 183.

Figure 2E:
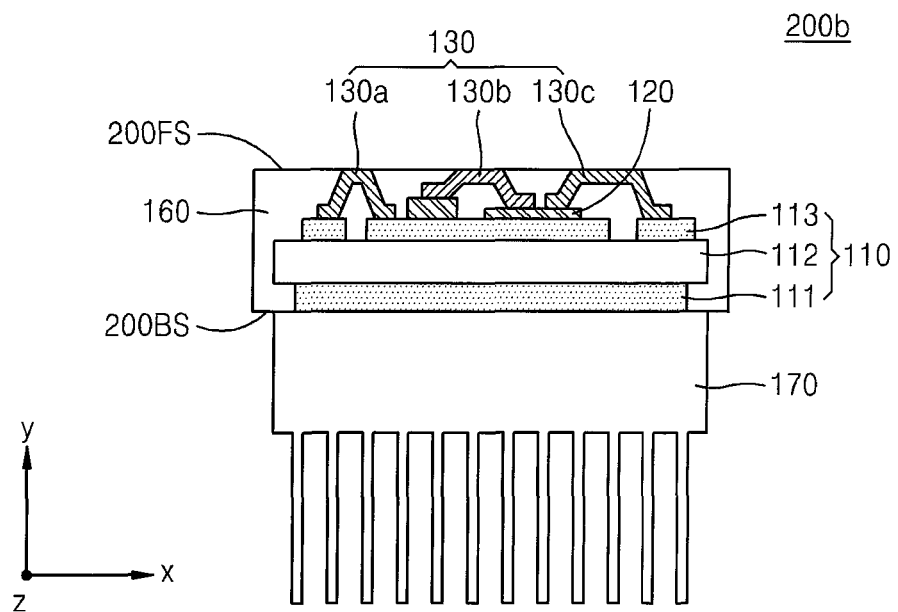
FIG. 2E is a cross-sectional view of a semiconductor package according to another embodiment of the present invention.

FIG. 2E is a cross-sectional view illustrating a semiconductor package 200b according to another embodiment of the present invention. In FIG. 2E, the same reference numerals as in FIG. 2A denote the same components, and thus, repeated descriptions with respect to FIG. 2A are omitted.

Referring to FIG. 2E, the semiconductor package 200b includes the heat sink 170. The heat sink 170 is attached onto the lower surface 200BS of the semiconductor package 200b, in detail, onto the lower surface of the substrate 110 exposed by the sealing member 160. Accordingly, heat generated from the semiconductor chip 120 is rapidly dissipated to the heat sink 170 through the lower surface of the substrate 110, that is, through the lower surface of the lower conductive pattern 111. The heat sink 170 may be attached to the lower surface of the sealing member 160 and the lower surface of the substrate 110 by a contact layer and/or a mechanical coupling structure.

Figure 3A:
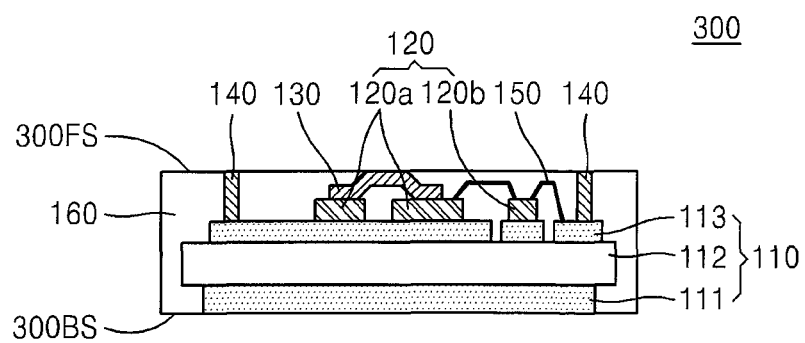
FIG. 3A is a cross-sectional view of a semiconductor package according to another embodiment of the present invention.
Figure 3B:
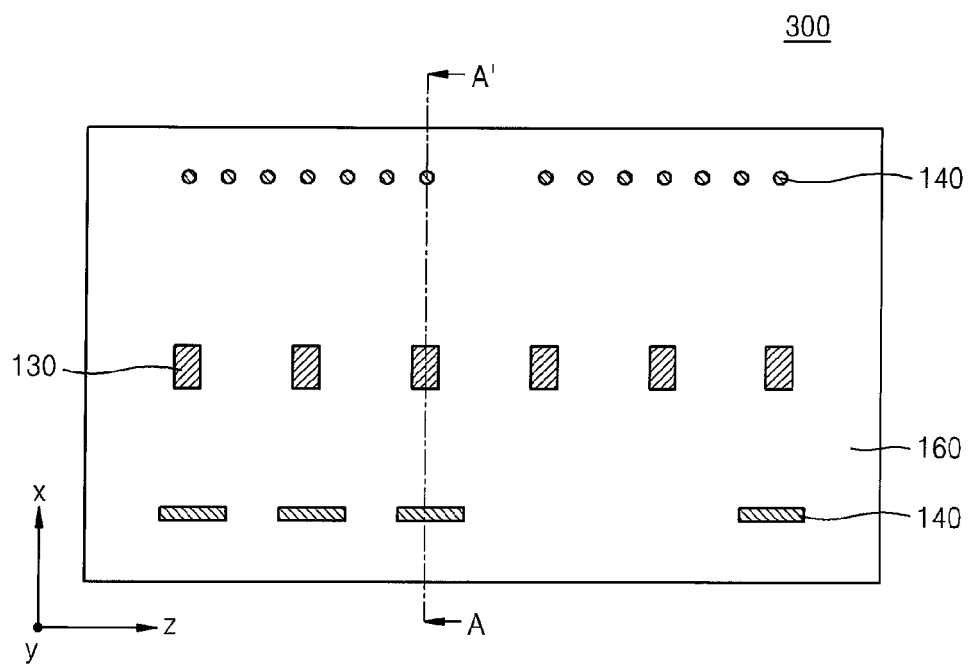
FIG. 3B is a top view of the semiconductor package of FIG. 3A.
Figure 3C:
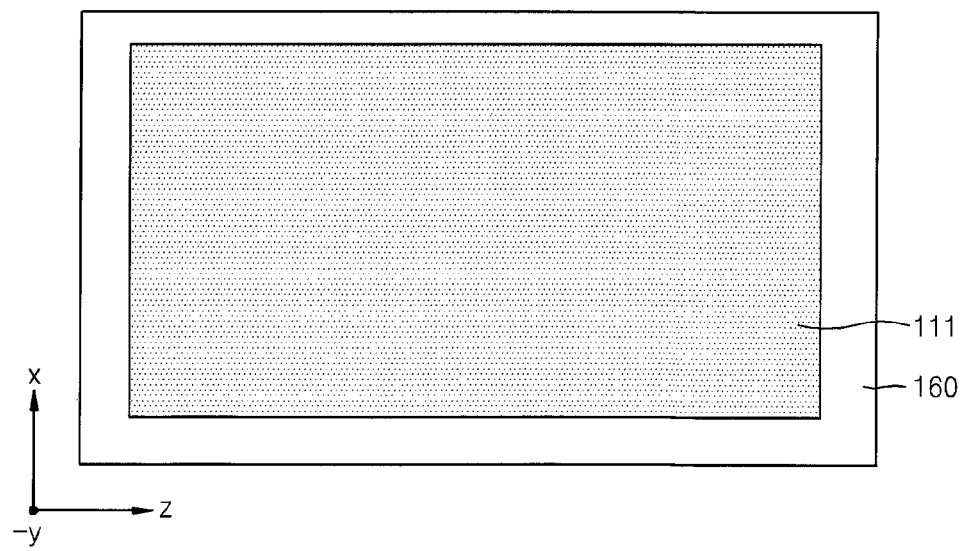
FIG. 3C is a bottom view of the semiconductor package of FIG. 3A.
Figure 3D:
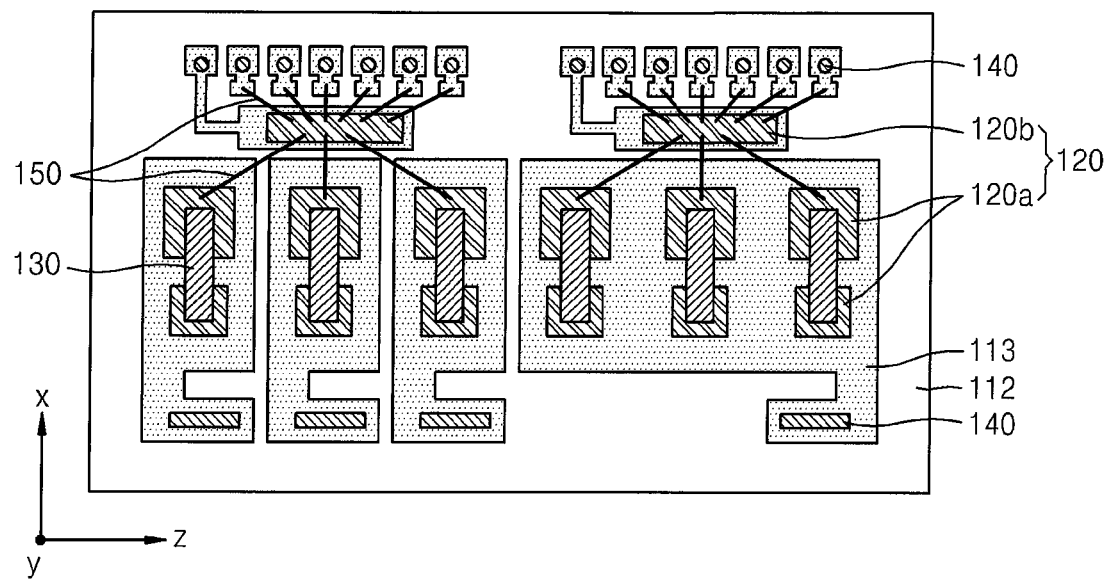
FIG. 3D is a top view of the semiconductor package of FIG. 3B that does not include a sealing member.

FIG. 3A is a cross-sectional view of a semiconductor package 300 according to another embodiment of the present invention. FIG. 3B is a top view of the semiconductor package 300 of FIG. 3A. FIG. 3C is a bottom view of the semiconductor package 300 of FIG. 3A. FIG. 3A illustrates the semiconductor package 300 taken along a line A-A' of FIG. 3B. FIG. 3D is a top view of the semiconductor package 300 of FIG. 3B that does not include the sealing member 160 to easily understand a structure of the semiconductor package 300 of FIG. 3A.

In FIGS. 3A through 3D, the same reference numerals as in FIGS. 1A through 1D denote the same components, and thus, repeated descriptions with respect to FIGS. 1A *through* 1D are omitted.

Referring to FIGS. 3A through 3D, a plurality of semiconductor chips 120 are disposed on a conductive pattern 113 of the substrate 110. The semiconductor chips 120 may include first semiconductor chips 120a and a second semiconductor chip 120b.

For example, the second semiconductor chip 120b to which a bonding wire 150 is connected may include an integrated circuit (IC) die. In this case, the semiconductor package 300 may include a SPM inverter module.

The first semiconductor chips 120a may be electrically connected to each other via the connecting member 130, for example, a bonding clip. The first semiconductor chip 120a and the second semiconductor chip 120b may be electrically connected to each other via a bonding wire 150. The second semiconductor chip 120b and the conductive pattern 113 may be electrically connected to each other via the bonding wire 150.

The lower portion of the substrate 110, for example, the lower portion of the conductive patter 111, and a part of an upper surface of the connecting member 130, for example, a center portion of the upper surface of the connecting member 130, are exposed to the outside by the sealing member 160. The lower surface of the sealing member 160 and the lower surface of the substrate 110 may be coplanar, thereby forming a lower surface 300BS of the semiconductor package 300.

Also, the upper surface of the sealing member 160 and the upper surface of the connecting member 130 may be coplanar, thereby forming an upper surface 300FS of the semiconductor package 300.

Heat generated from the semiconductor chip 120 may be effectively dissipated to the outside through the upper surface of the connecting member 130 and the lower surface of the substrate 110 that are exposed by the sealing member 160. That is, in the semiconductor package 300, heat generated from the semiconductor chip 120 may be effectively dissipated to the outside through the upper surface 300FS and the lower surface 300BS of the semiconductor package 300. Also, the semiconductor chip 120 may be electrically connected to the outside of the semiconductor package 300 through the upper surface of the connecting member 130 that is exposed by the sealing member 160. For example, as illustrated in FIG. 1F, the upper surface of the connecting member 130 that is exposed to the outside by the sealing member 160 may be electrically connected to the PCB 185 via the soldering member 183.

Figure 3E:
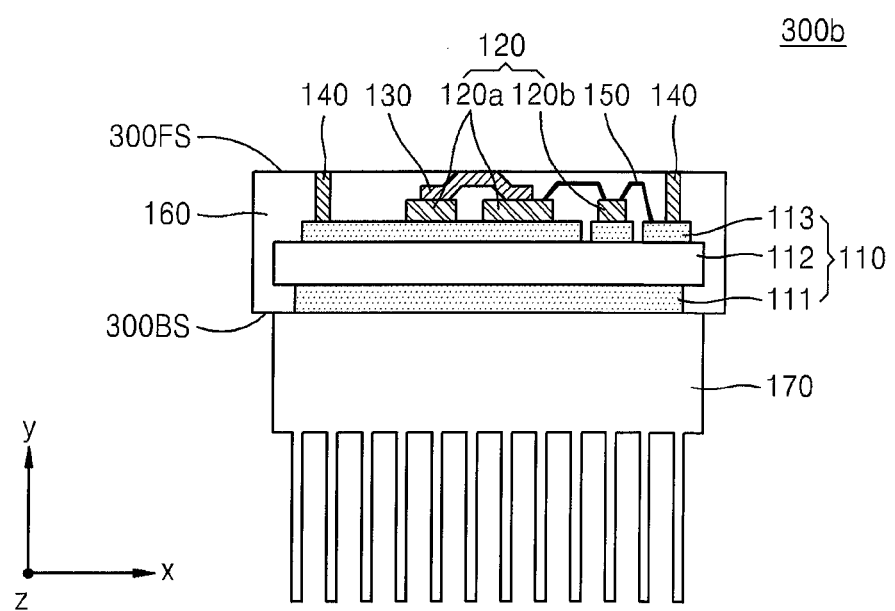
FIG. 3E is a cross-sectional view of a semiconductor package according to another embodiment of the present invention.

FIG. 3E is a cross-sectional view illustrating a semiconductor package, according to another embodiment of the present invention. In FIG. 3E, the same reference numerals as in FIG. 3A denote the same components, and thus, repeated descriptions with respect to FIG. 3A are omitted.

Referring to FIG. 3E, the semiconductor package 300*b* includes the heat sink 170. The heat sink 170 is attached onto the lower surface 300BS of the semiconductor package 300*b*, in detail, onto the lower surface of the substrate 110 exposed by the sealing member 160. Accordingly, heat generated from the semiconductor chip 120 is rapidly dissipated to the heat sink 170 through the lower surface of the substrate 110, that is, through the lower surface of the lower conductive pattern 111. The heat sink 170 may be attached to the lower surface of the sealing member 160 and the lower surface of the substrate 110 by a contact layer and/or a mechanical coupling structure.

Figure 4A:
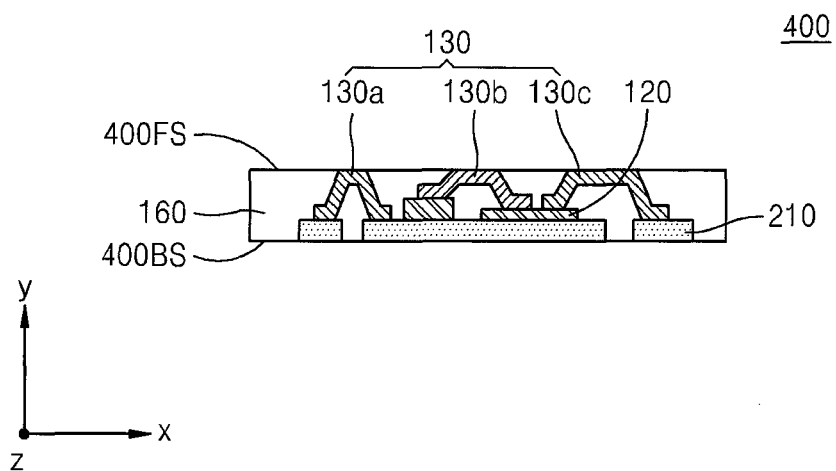
FIG. 4A is a cross-sectional view of a semiconductor package according to another embodiment of the present invention.
Figure 4B:
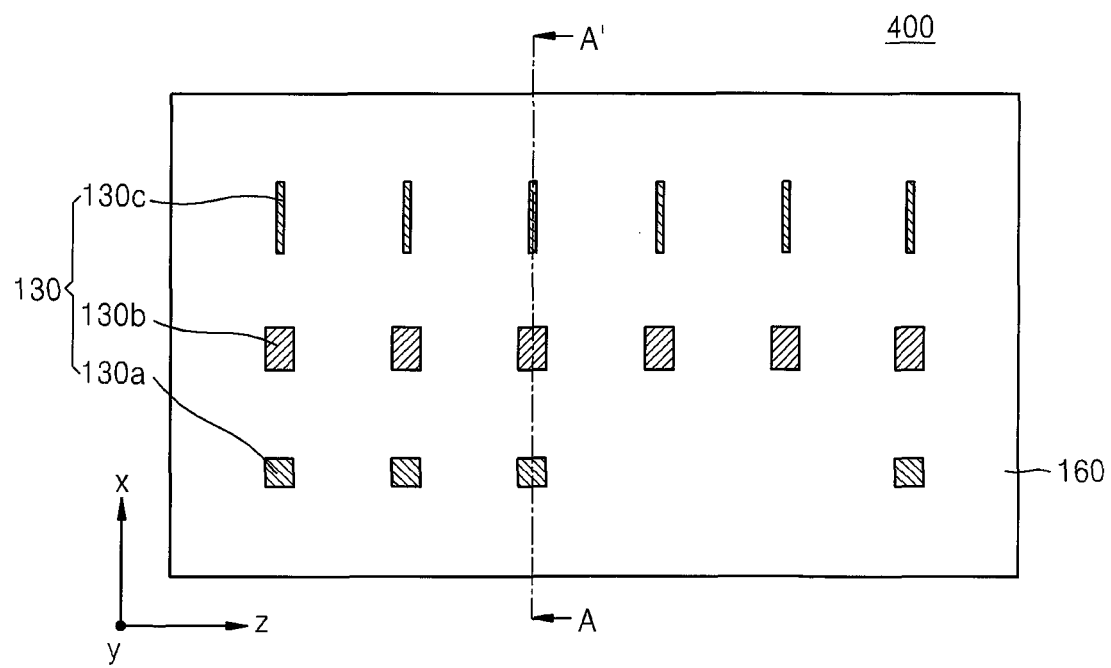
FIG. 4B is a top view of the semiconductor package of FIG. 4A.
Figure 4C:
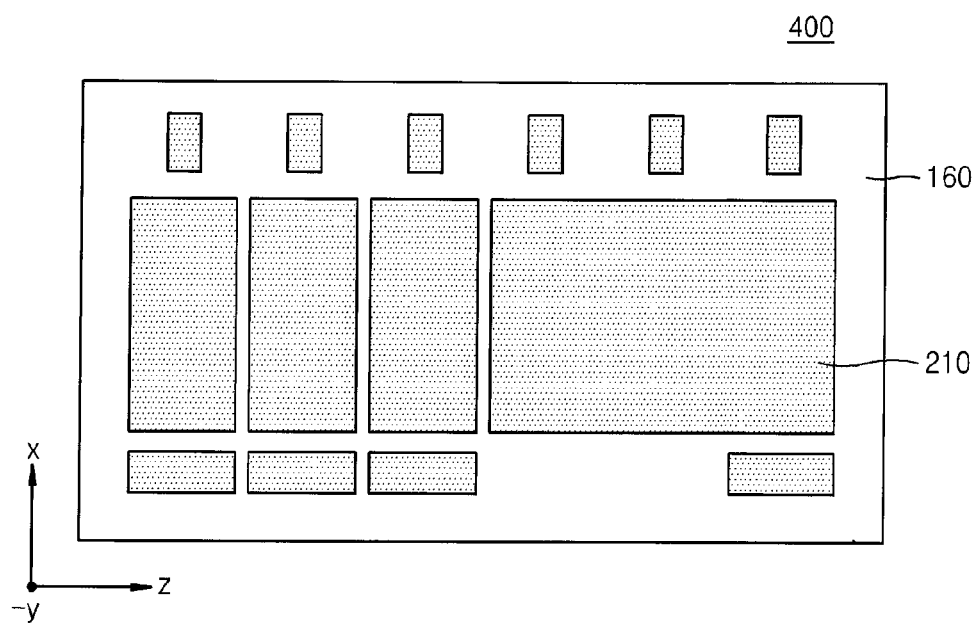
FIG. 4C is a bottom view of the semiconductor package of FIG. 4A.
Figure 4D:
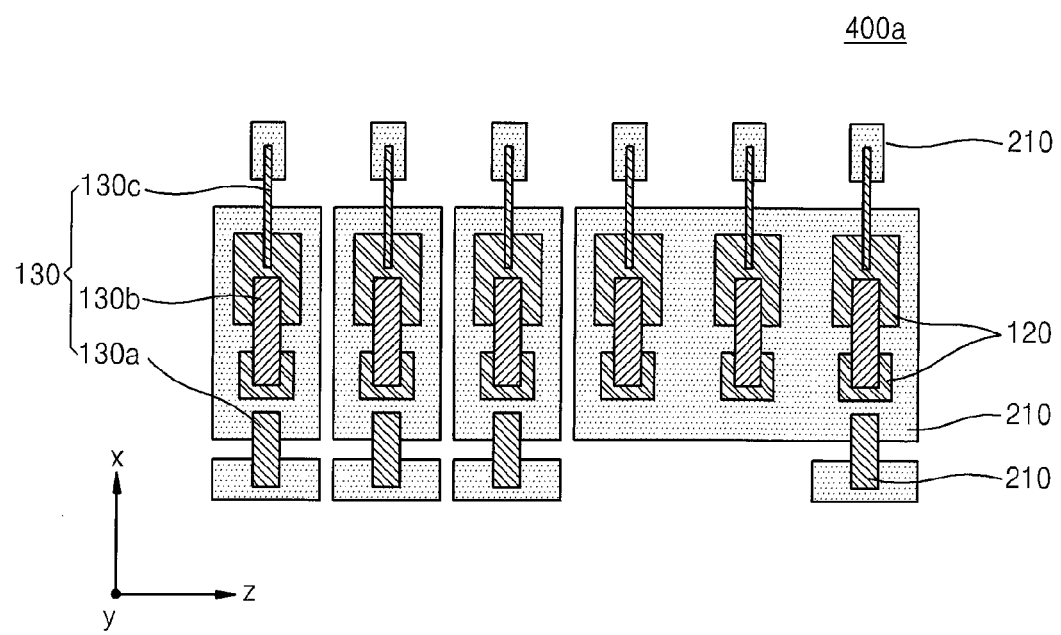
FIG. 4D is a top view of the semiconductor package of FIG. 4B that does not include a sealing member, according to an embodiment of the present invention.

FIG. 4A is a cross-sectional view of a semiconductor package 400 according to another embodiment of the present invention. FIG. 4B is a top view of the semiconductor package 400 of FIG. 4A. FIG. 4C is a bottom view of the semiconductor package 400 of FIG. 4A. FIG. 4A illustrates the semiconductor package 400 taken along a line A-A' of FIG. 4B. FIG. 4D is a top view illustrating the semiconductor package 400 of FIG. 4B that does not include the sealing member 160 to easily understand a structure of the semiconductor package 400 of FIG. 4A.

In FIGS. 4A through 4D, the same reference numerals as in FIGS. 1A through 1D denote the same components, and thus, repeated descriptions with respect to FIGS. 1A *through* 1D are omitted.

Referring to FIGS. 4A through 4D, the semiconductor package 400 includes a substrate 210 including a plurality of conductive patterns spaced apart from each other. The substrate 210 may be lead frames instead of an insulated substrate. The lead frames 210 may be formed of a metal or a metal alloy. Semiconductor chips 120 may be bonded to the lead frame 210 by soldering or by using a conductive epoxy.

The lead frames 210 may be electrically connected to each other via a first connecting member 130*a*, the semiconductor chips 120 may be electrically connected to each other via a second connecting member 130*b*, and the lead frame 210 and the semiconductor chip 120 may be electrically connected to each other via a third connecting member 130*c*.

A lower surface of the lead frame 210 and a part of an upper surface of a connecting member 130, for example, a center portion of the upper surface of the connecting member 130, are exposed to the outside by the sealing member 160. A lower surface of the sealing member 160 and the lower surface of the lead frame 210 may be coplanar, thereby forming a lower surface 400BS of the semiconductor package 400. Also, an upper surface of the sealing member 160 and the upper surface of the connecting member 130 may be coplanar, thereby forming an upper surface 400 FS of the semiconductor package 400.

Heat generated from the semiconductor chip 120 may be effectively dissipated to the outside through the upper surface of the connecting member 130 and the lower surface of the lead frame 210 that are exposed by the sealing member 160. That is, in the semiconductor package 400, heat generated from the semiconductor chip 120 may be effectively dissipated to the outside through the upper surface 400FS and the lower surface 400BS of the semiconductor package 400. Also, the semiconductor chip 120 may be electrically connected to the outside of the semiconductor package 400 through the upper surface of the connecting member 130 that is exposed by the sealing member 160. For example, as illustrated in FIG. 1F, the upper surface of the connecting member 130 that is exposed to the outside by the sealing member 160 may be electrically connected to the PCB 185 via the soldering member 183.

Figure 4E:
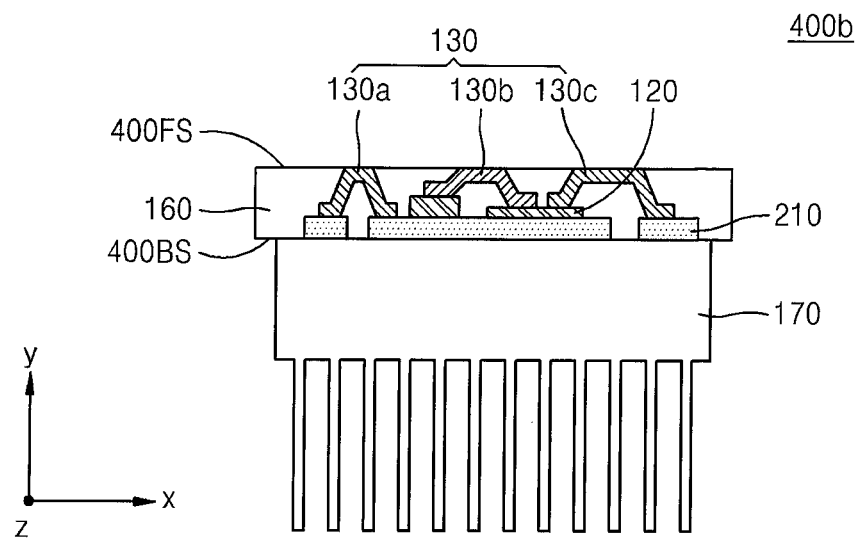
FIG. 4E is a cross-sectional view of a semiconductor package according to another embodiment of the present invention.

FIG. 4E is a cross-sectional view of a semiconductor package 400*b* according to another embodiment of the present invention. In FIG. 4E, the same reference numerals as in FIG. 4A denote the same components, and thus, repeated descriptions with respect to FIG. 4A are omitted.

Referring to FIG. 4E, the semiconductor package 400*b* includes the heat sink 170. The heat sink 170 is attached onto the lower surface 400BS of the semiconductor package 400*b*, in detail, onto a lower surface of the lead frame 210 exposed by the sealing member 160. Accordingly, heat generated from the semiconductor chip 120 is rapidly dissipated to the heat sink 170 through the lower surface of the lead frame 210. The heat sink 170 may be attached to the lower surface of the sealing member 160 and the lower surface of the lead frame 210 by a contact layer and/or a mechanical coupling structure.

FIGS. 5A through 5G are top views for describing a method of manufacturing the semiconductor package 100 of FIG. 1A, according to an embodiment of the present invention.

Figure 5A:
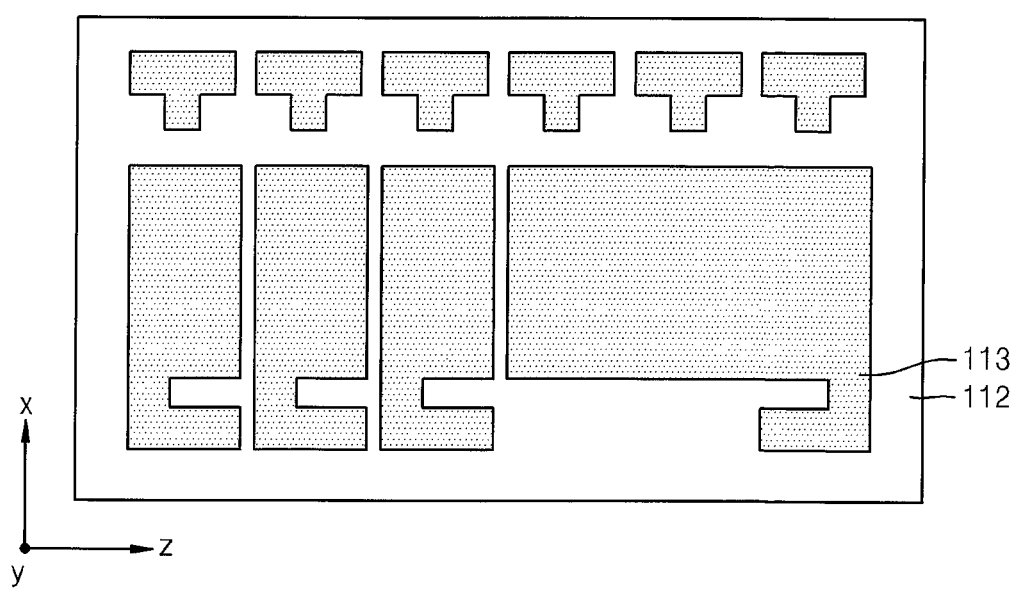
FIGS. 5A through 5G are top views for describing a method of manufacturing the semiconductor package of FIG. 1A, according to an embodiment of the present invention.

Referring to FIG. 5A, a substrate including a plurality of conductive patterns 113 spaced apart from one another is prepared. The substrate, as illustrated in FIG. 1A, may be a DBC substrate including the ceramic insulating film 112, the plurality of upper conductive patterns 113 disposed on the ceramic insulating film 112, and the lower conductive pattern 111 disposed under the ceramic insulating film 112.

Figure 5B:
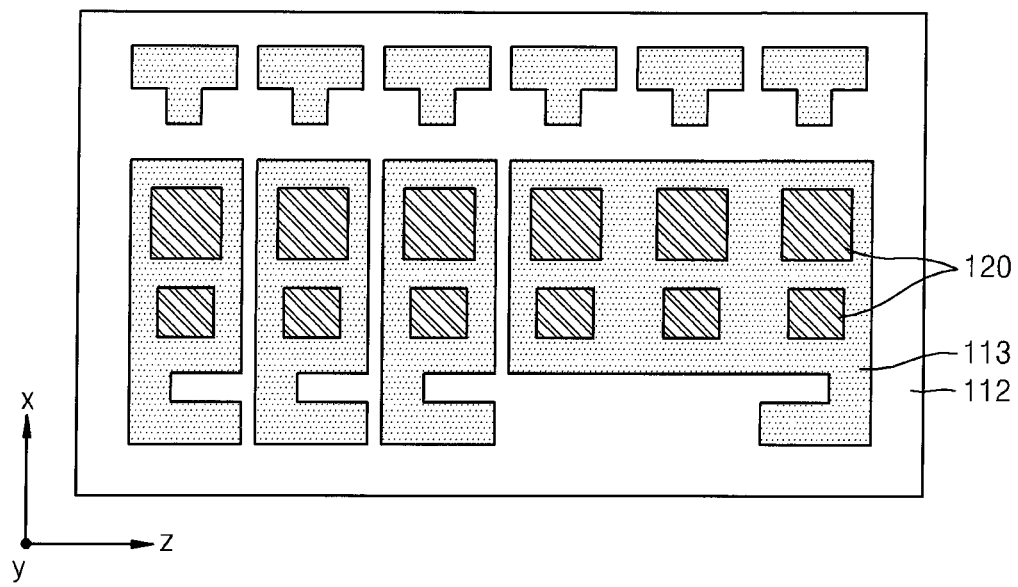

Referring to FIG. 5B, the plurality of semiconductor chips 120 are mounted on each conductive pattern 113. The semiconductor chips 120 may be bonded to the conductive pattern 113 by soldering or by using a conductive epoxy.

Figure 5C:
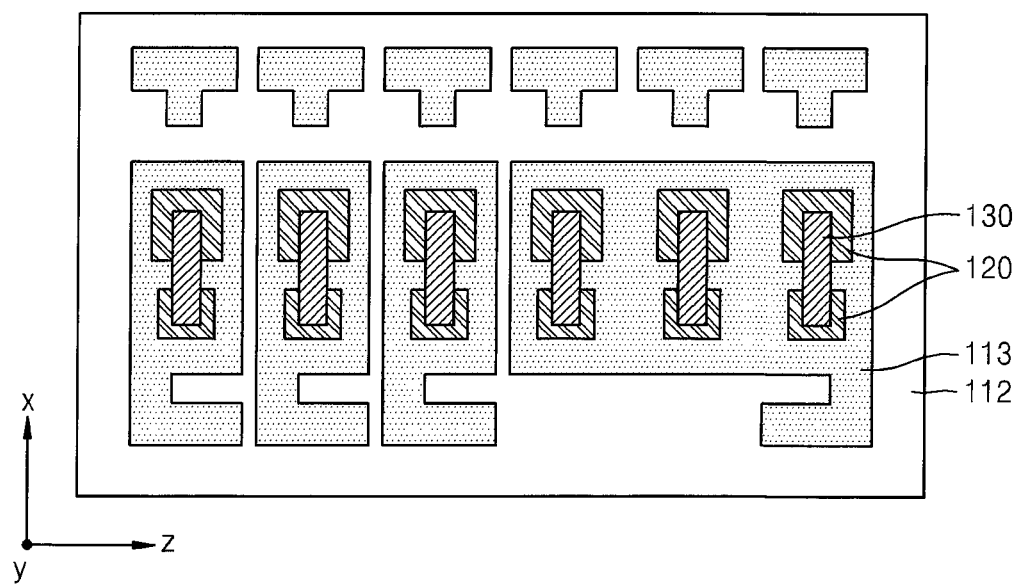

Referring to FIG. 5C, the semiconductor chips 120 are electrically connected to each other via the connecting member 130. The connecting member 130 may be any one selected from the group consisting of a bonding clip and a bonding ribbon, or a combination thereof. The connecting member 130 may have a shape in which a level of a center portion thereof is higher than both end portions bonded to the semiconductor chip 120, and the center portion of the connecting member 130 may have an area having a constant level. This shape of the connecting member 130 may be easily realized when the connecting member 130 is a bonding clip.

Figure 5D:
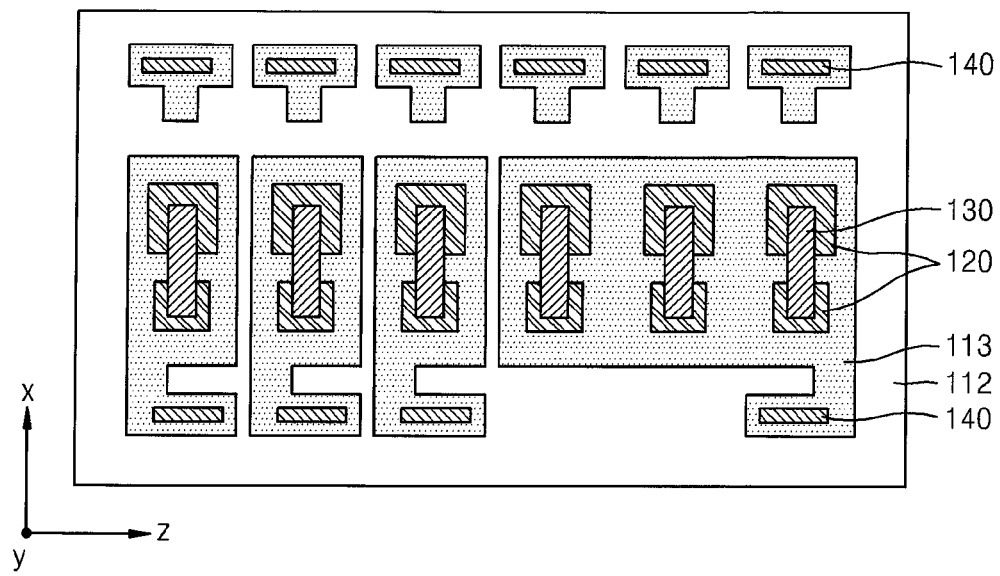

Referring to FIG. 5D, the metal slug 140 is formed on the conductive pattern 113. The metal slug 140 may be used to electrically connect the conductive pattern 113 to the outside of the semiconductor package 100 and to discharge heat generated from the semiconductor package 100 to the outside.

Figure 5E:
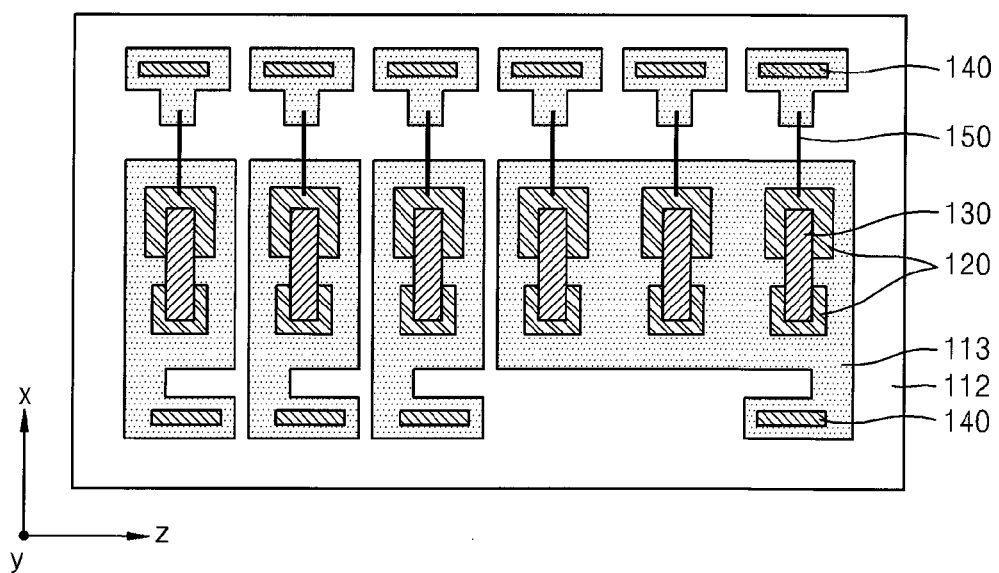

Referring to FIG. 5E, the bonding wire 150 for electrically connecting the semiconductor chip 120 and the conductive pattern 113 is formed.

The order of the operations illustrated in FIGS. 5C through 5E may be arbitrarily changed.

Figure 5F:
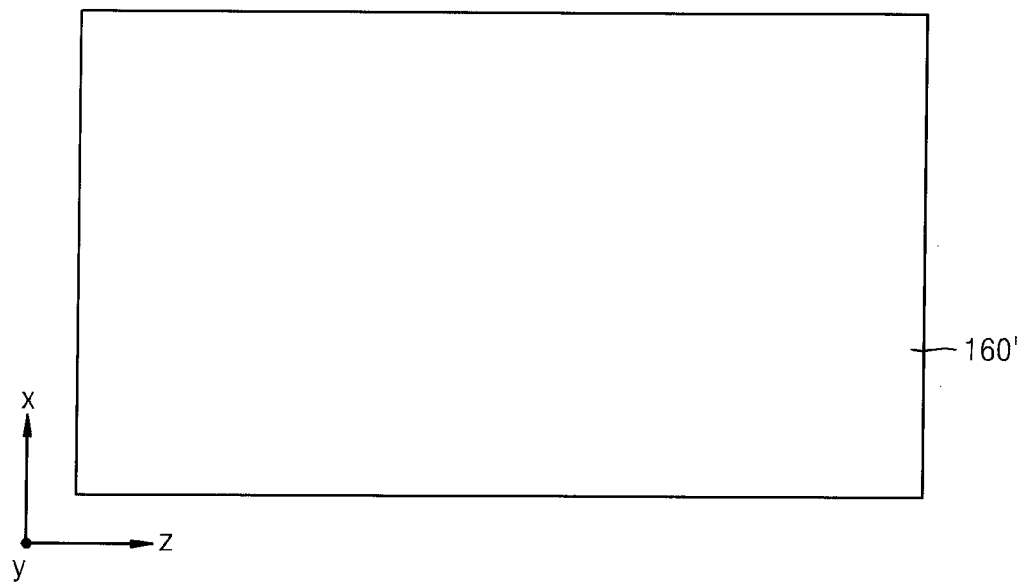

Referring to FIG. 5F, a first sealing member 160' covering the substrate, the semiconductor chip 120, and the connecting member 130 is formed. The first sealing member 160' may be formed to cover the entire upper surface of the connecting member 130. Also, the first sealing member 160' may be formed to cover all upper surfaces and side surfaces of the substrate. However, the first sealing member 160' may be formed to expose a lower surface of the substrate 110, that is, a lower surface of the lower conductive pattern 111.

Figure 5G:
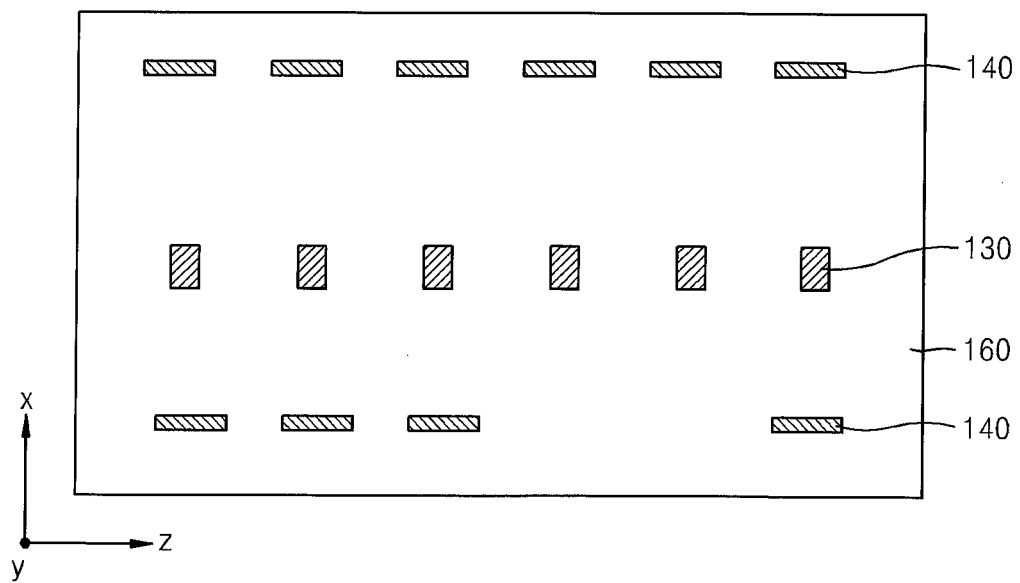

Referring to FIG. 5G, the sealing member 160 is formed by grinding an upper surface of the first sealing member 160' until upper portions of the connecting members 130, that is, the center portions each between the both end portions of the connecting member 130, and/or upper surfaces of metal slugs 140 are exposed. Accordingly, the upper surfaces of the connecting members 130 and/or the upper surfaces of the metal slugs 140 are exposed by the sealing member 160, thereby forming the semiconductor package 100 illustrated in FIG. 1B. A warpage phenomena occurring in the semiconductor package 100 when forming the first sealing member 160' may be prevented through the grinding process.

In the method of manufacturing the semiconductor package 100 according to another embodiment of the present invention, as illustrated in FIG. 5F, after the first sealing member 160' is formed, the sealing member 160 may be directly formed so as to expose the upper surfaces of the connecting members 130 and/or the upper surfaces of the metal slugs 140 without performing the grinding process. That is, after performing the operation illustrated in FIG. 5E, the operation illustrated in FIG. 5G may be directly performed without performing the operation illustrated in FIG. 5F. In this method of manufacturing the semiconductor package 100, a warpage phenomena occurring in the semiconductor package 100 due to formation of the first sealing member 160' may be prevented. However, a process of removing unnecessary portions of the sealing member 160 by using a laser so as to expose the upper surfaces of the connecting members 130 and/or the upper surfaces of the metal slugs 140 may be required.

A plating process may be performed on the upper surfaces of the connecting members 130 and/or the upper surfaces of the metal slugs 140. A plating metal layer may be formed on the upper surfaces of the connecting members 130 and/or the upper surfaces of the metal slugs 140 through the plating process, wherein the plating metal layer may be formed of Sn, Ni/Au, or Ni/Pd/Au. The plating process may improve a performance of a soldering member that may be formed on each of the upper surfaces of the connecting members 130 and/or each of the upper surfaces of the metal slugs 140, for example, the soldering member 183 illustrated in FIG. 1F.

FIGS. 6A through 6E are top views for describing a method of manufacturing the semiconductor package 200 of FIG. 2A, according to another embodiment of the present invention.

Figure 6A:
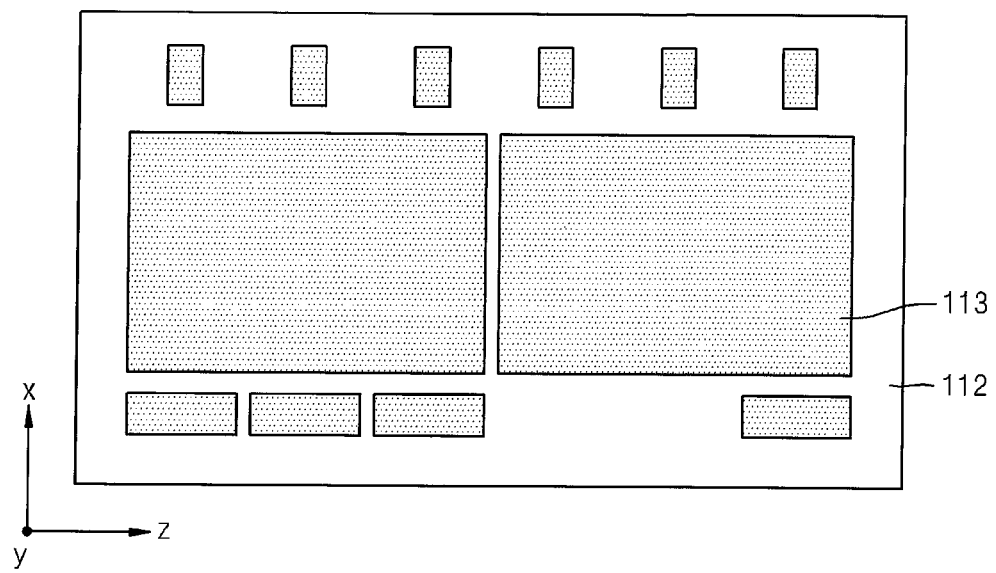
FIGS. 6A through 6E are top views for describing a method of manufacturing the semiconductor package of FIG. 2A, according to another embodiment of the present invention.

Referring to FIG. 6A, a substrate including a plurality of conductive patterns 113 spaced apart from one another is prepared. The substrate, as illustrated in FIG. 1A, may be a DBC substrate including the ceramic insulating film 112, the plurality of upper conductive patterns 113 disposed on the ceramic insulating film 112, and the lower conductive pattern 111 disposed under the ceramic insulating film 112.

Figure 6B:
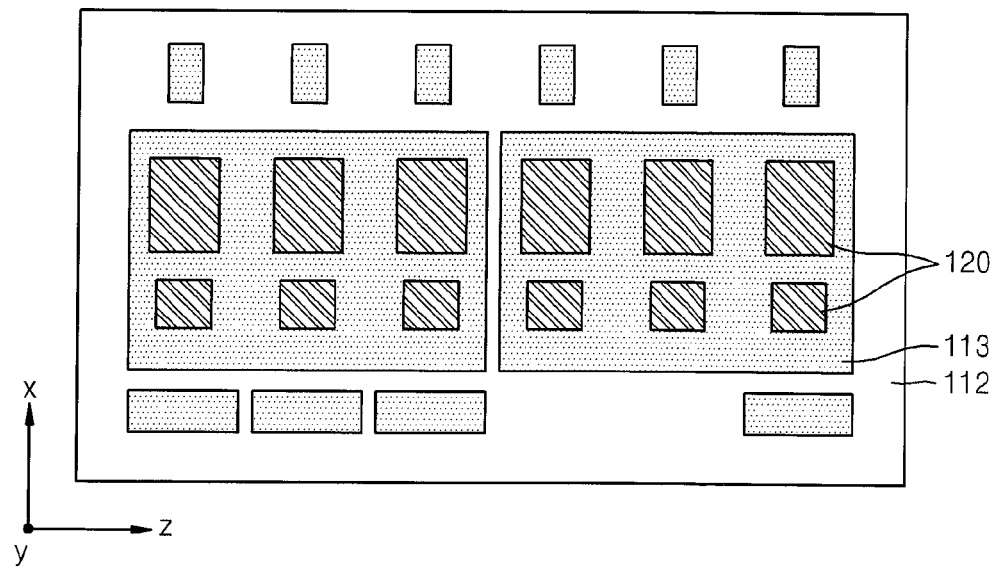

Referring to FIG. 6B, the plurality of semiconductor chips 120 are mounted on each conductive pattern 113. The semiconductor chips 120 may be bonded to the conductive pattern 113 by soldering or by using a conductive epoxy.

Figure 6C:
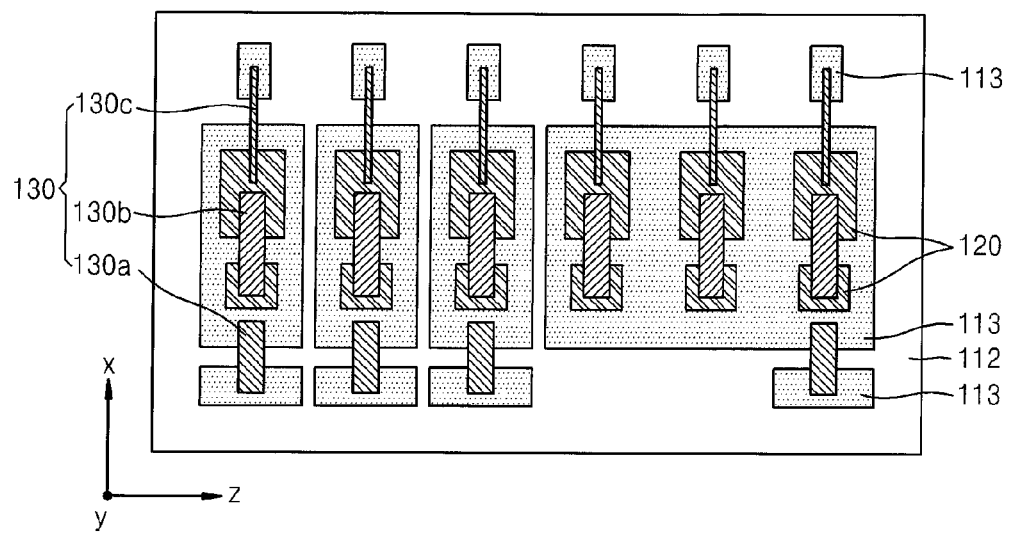

Referring to FIG. 6C, the connecting member 130 is used to electrically connect the semiconductor chips 120 to each other, to electrically connect the conductive patterns 113 to each other, and to electrically connect the conductive pattern 113 and the semiconductor chip 120 to each other. In detail, the conductive patterns 113 may be electrically connected to each other via the first connecting member 130a, the semiconductor chips 120 may be electrically connected to each other via the second connecting member 130b, and the semiconductor chip 120 and the conductive pattern 113 may be electrically connected to each other via the third connecting member 130c. The connecting member 130 may be any one selected from the group consisting of a bonding clip and a bonding ribbon, or a combination thereof. The connecting member 130 may have a shape in which a level of a center portion thereof is higher than both end portions, and the center portion of the connecting member 130 may have an area having a constant level. This shape of the connecting member 130 may be easily realized when the connecting member 130 is a bonding clip.

Figure 6D:
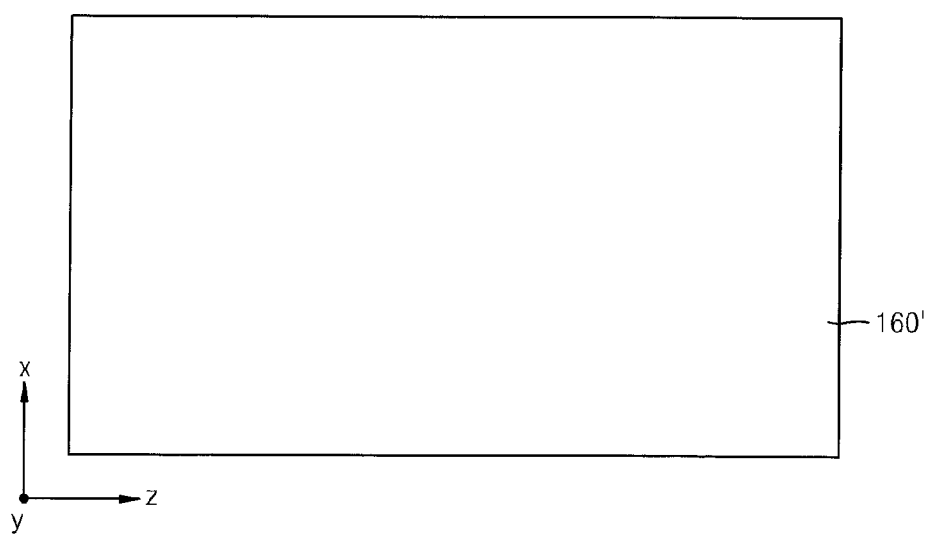

Referring to FIG. 6D, a first sealing member 160' covering the substrate, the semiconductor chip 120, and the connecting member 130 is formed. The first sealing member 160' may be formed to cover the entire upper surface of the connecting member 130. Also, the first sealing member 160' may be formed to cover all upper surfaces and side surfaces of the substrate. However, the first sealing member 160' may be formed to expose a lower surface of the substrate 110, that is, a lower surface of the lower conductive pattern 111.

Figure 6E:
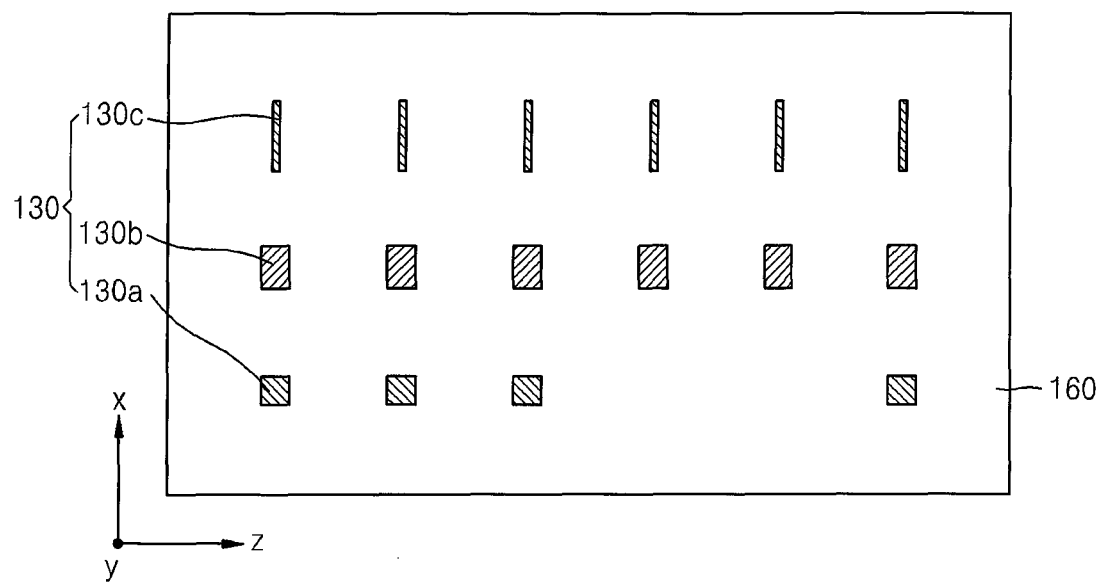

Referring to FIG. 6E, the sealing member 160 is formed by grinding an upper surface of the first sealing member 160' until upper portions of the connecting members 130, that is, the center portions each between the both end portions of the connecting member 130 are exposed. Accordingly, the upper surfaces of the connecting members 130 are exposed by the sealing member 160, thereby forming the semiconductor package 200 illustrated in FIG. 2B. A warpage phenomena occurring in the semiconductor package 200 when forming the first sealing member 160' may be prevented through the grinding process.

In the method of manufacturing the semiconductor package 200 according to another embodiment of the present invention, as illustrated in FIG. 6D, after the first sealing member 160' is formed, the sealing member 160 may be directly formed so as to expose the upper surfaces of the connecting members 130 without performing the grinding process. That is, after performing the operation illustrated in FIG. 6C, the operation illustrated in FIG. 6E may be directly performed without performing the operation illustrated in FIG. 6D. In this method of manufacturing the semiconductor package 200, a warpage phenomena occurring in the semiconductor package 200 due to formation of the first sealing member 160' may be prevented. However, a process of removing unnecessary portions of the sealing member 160 by using a laser so as to expose the upper surfaces of the connecting members 130 may be required.

FIGS. 7A through 7E are top views for describing a method of manufacturing the semiconductor package 400 of FIG. 4A, according to another embodiment of the present invention.

Figure 7A:
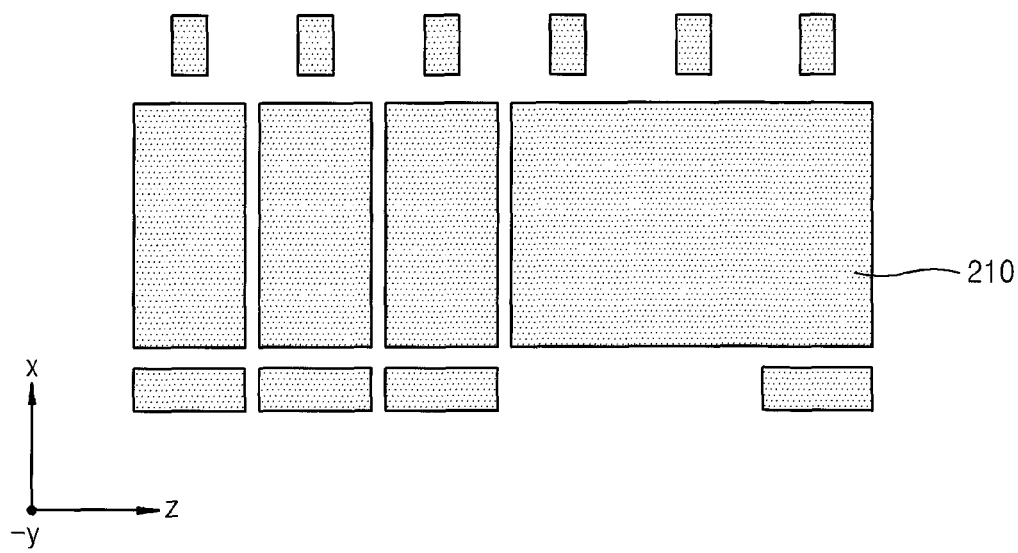
FIGS. 7A through 7E are top views for describing a method of manufacturing the semiconductor package of FIG. 4A, according to another embodiment of the present invention.

Referring to FIG. 7A, the substrate 210 including a plurality of conductive patterns spaced apart from each other is prepared. The substrate 210 may be a lead frame formed of a metal or a metal alloy, as illustrated in FIG. 4A.

Figure 7B:
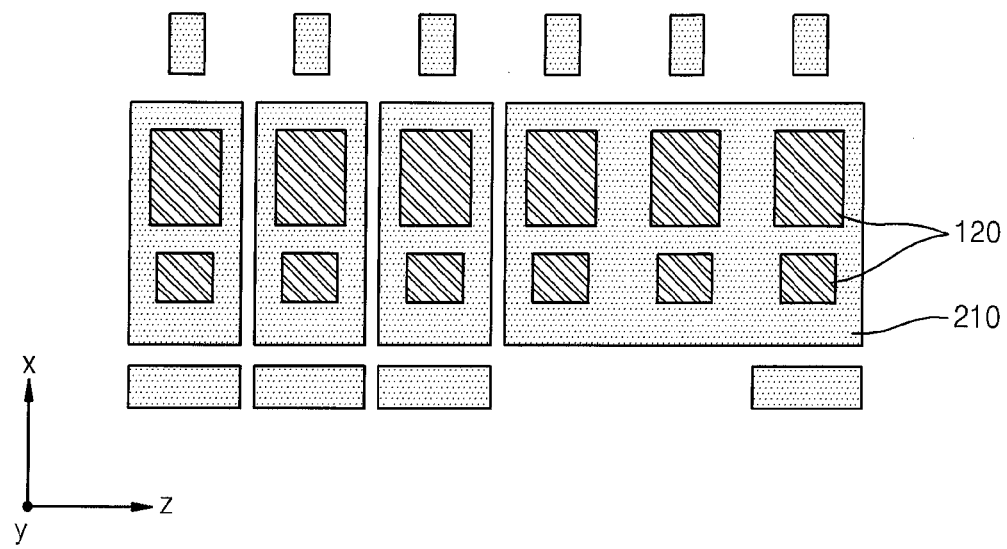

Referring to FIG. 7B, the plurality of semiconductor chips 120 are mounted on conductive patterns of the substrates 210. The semiconductor chips 120 may be bonded to the conductive patterns of the substrates 210 by soldering or by using a conductive epoxy.

Figure 7C:
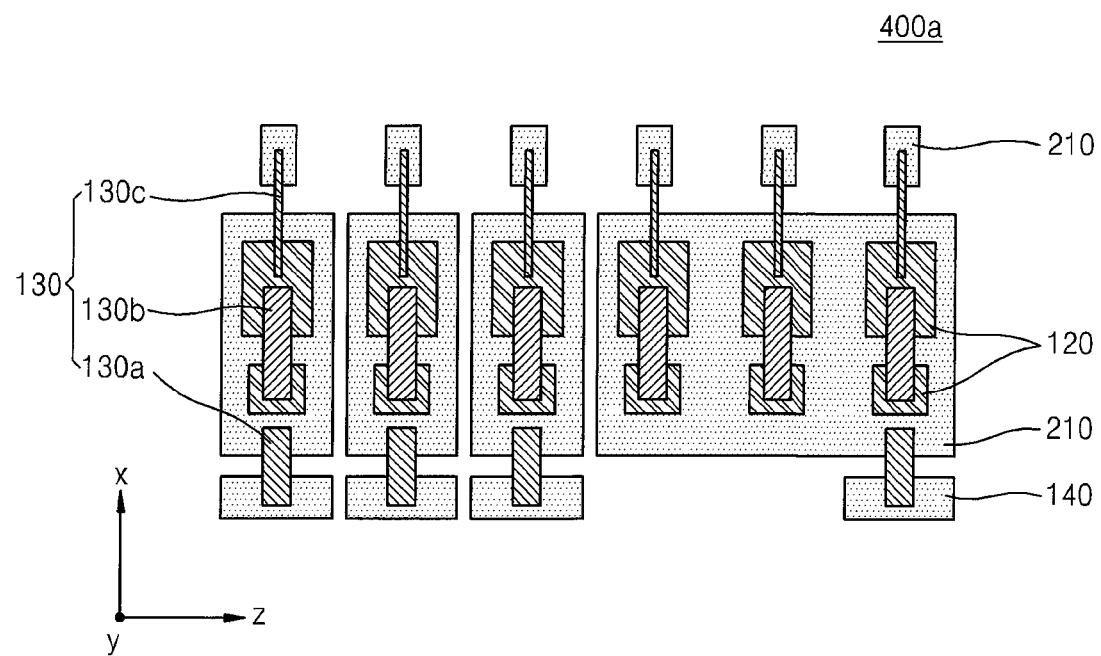

Referring to FIG. 7C, the connecting member 130 is used to electrically connect the semiconductor chips 120 to each other, the conductive patterns of the substrates 210 to each other, and the conductive pattern of the substrate 210 and the semiconductor chip 120 to each other. In detail, the conductive patterns of the substrate 210 may be electrically connected to each other via the first connecting member 130a, the semiconductor chips 120 may be electrically connected to each other via the second connecting member 130b, and the semiconductor chips 120 and the conductive patterns of the substrates 210 may be electrically connected to each other via the third connecting member 130c. The connecting member 130 may be any one selected from the group consisting of a bonding clip and a bonding ribbon, or a combination thereof. The connecting member 130 may have a shape in which a level of a center portion thereof is higher than both end portions, and the center portion of the connecting member 130 may have an area having a constant level. This shape of the connecting member 130 may be easily realized when the connecting member 130 is a bonding clip.

Figure 7D:
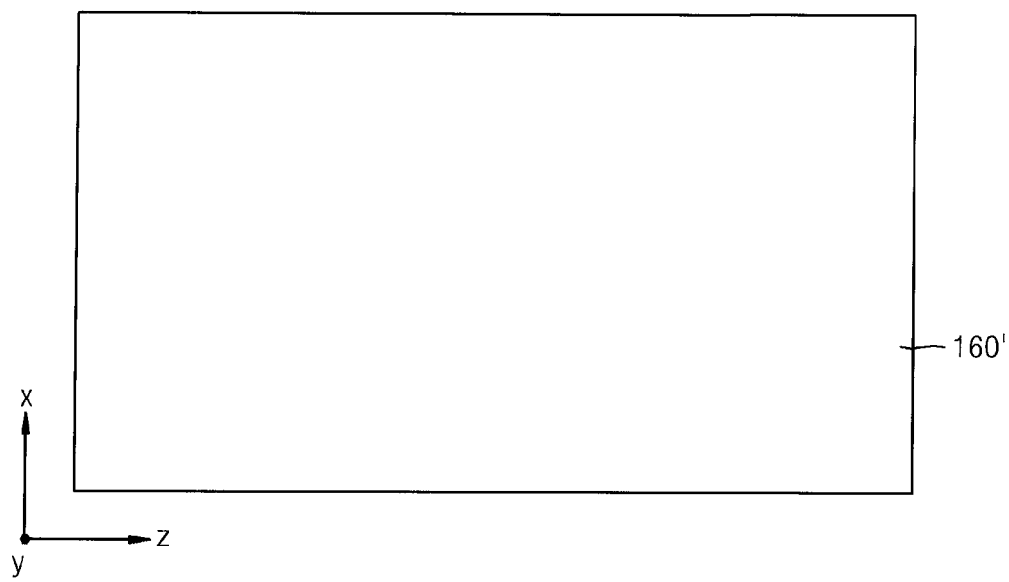

Referring to FIG. 7D, a first sealing member 160' covering the conductive patterns of the substrates 210, the semiconductor chips 120, and the connecting members 130 is formed. The first sealing member 160' may be formed to cover the entire upper surfaces of the connecting members 130. Also, the first sealing member 160' may be formed to cover all upper surfaces and side surfaces of the conductive patterns of the substrates 210. However, the first sealing member 160' may be formed to expose lower surfaces of the conductive patterns of the substrates 210.

Figure 7E:
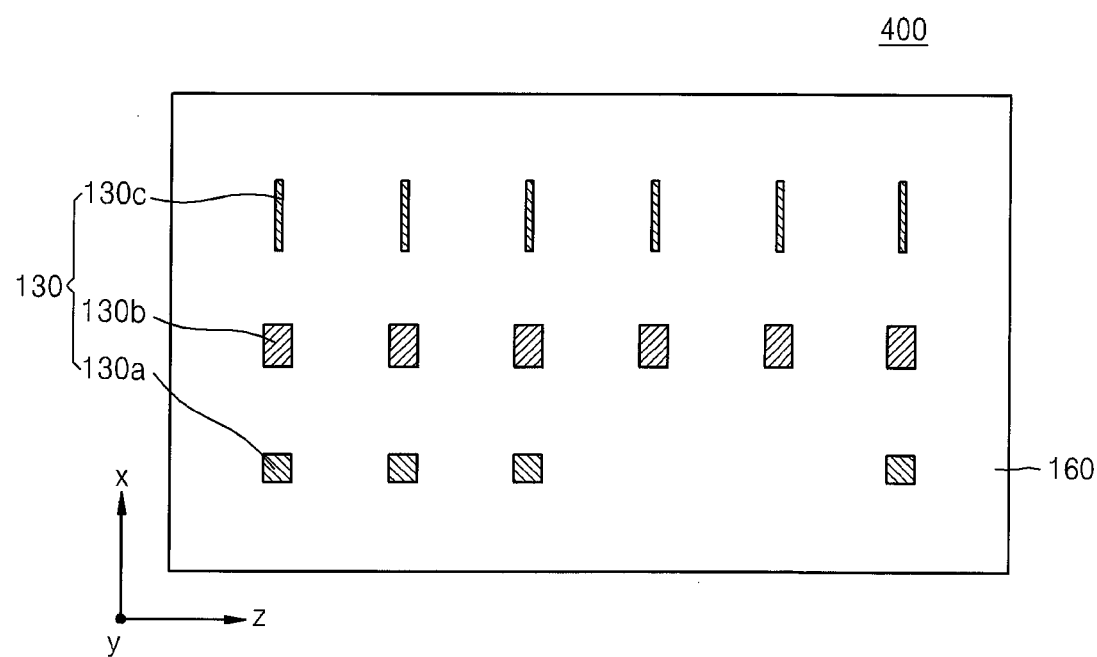

Referring to FIG. 7E, the sealing member 160 is formed by grinding an upper surface of the first sealing member 160' until upper portions of the connecting members 130, that is, the center portions each between the both end portions of the connecting member 130 are exposed. Accordingly, the upper surfaces of the connecting members 130 are exposed by the sealing member 160, thereby forming the semiconductor package 400 illustrated in FIG. 4B. A warpage phenomena occurring in the semiconductor package 400 when forming the first sealing member 160' may be prevented through the grinding process.

In the method of manufacturing the semiconductor package 400 according to another embodiment of the present invention, as illustrated in FIG. 7D, after the first sealing member 160' is formed, the sealing member 160 may be directly formed so as to expose the upper surfaces of the connecting members 130 without performing the grinding process. That is, after performing the operation illustrated in FIG. 7C, the operation illustrated in FIG. 7E may be directly performed without performing the operation illustrated in FIG. 7D. In this method of manufacturing the semiconductor package 400, a warpage phenomena occurring in the semiconductor package 400 due to formation of the first sealing member 160' may be prevented. However, a process of removing unnecessary portions of the sealing member 160 by using a laser so as to expose the upper surfaces of the connecting members 130 may be required.

According to a semiconductor package according to the present invention and a method of manufacturing the same, since heat can be sufficiently dissipated through an upper surface and a lower surface of the semiconductor package, a performance of a semiconductor device may be stably realized.

Also, a thermal and electrical resistance of the semiconductor package may be decreased by using a connecting member such as a bonding clip.

In addition, by grinding an upper surface of a sealing member so as to expose upper surfaces of connecting members, a warpage phenomena occurring in a process of forming the sealing member may be improved and a height of the semiconductor package may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a support member having a first surface on which first and second conductive patterns are spaced apart from each other;
   at least one first semiconductor chip disposed on the first conductive pattern;
   a first connecting member for electrically connecting the second conductive pattern and the at least one first semiconductor chip; and
   a sealing member for sealing the first semiconductor chip and the first connecting member,
   wherein the first connecting member comprises an exposure surface exposed from an upper surface of the sealing member, a horizontal portion on which the exposure surface of the first connecting member is formed, and a first portion and a second portion that are formed on both sides of the horizontal portion and are each extended downward from the horizontal portion, wherein the first portion is connected to the first semiconductor chip and the second portion is connected to a different semiconductor chip or the second conductive pattern.

2. The semiconductor package of claim 1, wherein the exposure surface of the first connecting member is coplanar with the upper surface of the sealing member.

3. The semiconductor package of claim 1, wherein the first connecting member comprises at least one of a bonding clip and a bonding ribbon.

4. The semiconductor package of claim 1, wherein the exposure surface of the first connecting member is treated by a plating process.

5. The semiconductor package of claim 1, wherein the support member further comprises a third conductive pattern formed on a second surface opposite to the first surface,
   wherein the third conductive pattern is exposed from a lower surface of the sealing member.

6. The semiconductor package of claim 1, wherein the support member is one of a direct bonding copper (DBC) substrate, an insulated metal substrate (IMS), a metalizing ceramic substrate, and a lead frame.

7. The semiconductor package of claim 1, further comprising: a heat sink disposed on a second surface opposite to the first surface of the support member.

8. The semiconductor package of claim 1, further comprising: a bonding member formed on the exposure surface of the first connecting member.

9. The semiconductor package of claim 1, further comprising: a metal slug disposed at least one of the first and second conductive patterns and comprising an exposure surface exposed from the upper surface of the sealing member.

10. The semiconductor package of claim 1, wherein the first semiconductor chip is part of a plurality of semiconductor chips, further comprising:
  a second connecting member for electrically connecting the plurality of semiconductor chips to one another and comprising an exposure surface exposed from the upper surface of the sealing member.

11. The semiconductor package of claim 1, wherein a fourth conductive pattern spaced apart from the first and second conductive patterns is further formed on the first surface of the support member, further comprising:
  a third connecting member for electrically connecting the fourth and first conductive patterns and comprising an exposure surface exposed from the upper surface of the sealing member.

12. The semiconductor package of claim 1, wherein a fifth conductive pattern spaced apart from the first and second conductive patterns is further formed on the first surface of the support member, further comprising:
  at least one second semiconductor chip disposed on the fifth conductive pattern; and
  a fourth connecting member for electrically connecting the second and first semiconductor chips or the second semiconductor chip and the second conductive pattern.

13. A semiconductor package comprising:
  a support member having a first surface on which first and second conductive patterns are spaced apart from each other;
  at least one semiconductor chip disposed on the first conductive pattern;
  a first connecting member for electrically connecting the first and second conductive patterns to each other; and
  a sealing member for sealing the semiconductor chip and the first connecting member,
  wherein the first connecting member comprises an exposure surface exposed from an upper surface of the sealing member, a horizontal portion on which the exposure surface of the first connecting member is formed and a first portion and a second portion that are formed on both sides of the horizontal portion and are each extended downward from the horizontal portion, wherein the first portion is connected to the at least one semiconductor chip and the second portion is connected to a different semiconductor chip or the second conductive pattern.

14. The semiconductor package of claim 13, wherein the exposure surface of the first connecting member is coplanar with the upper surface of the sealing member.

15. The semiconductor package of claim 13, wherein the first connecting member comprises at least one of a bonding clip and a bonding ribbon.

16. A semiconductor package comprising:
  a support member having a first surface on which first and second conductive patterns are spaced apart from each other;
  a plurality of semiconductor chips disposed on the first conductive pattern;
  a first connecting member for electrically connecting the plurality of semiconductor chips to one another; and
  a sealing member for sealing the plurality of semiconductor chips and the first connecting member,
  wherein the first connecting member comprises an exposure surface exposed from an upper surface of the sealing member, a horizontal portion on which the exposure surface of the first connecting member is formed, and a first portion and a second portion that are formed on both sides of the horizontal portion and are each extended downward from the horizontal portion, wherein the first portion is connected to a first semiconductor chip in the plurality of semiconductor chips and the second portion is connected to a second semiconductor chip in the plurality of semiconductor chips or to the second conductive pattern.

17. The semiconductor package of claim 16, wherein the exposure surface of the first connecting member is coplanar with the upper surface of the sealing member.

18. The semiconductor package of claim 16, wherein the first connecting member comprises at least one of a bonding clip and a bonding ribbon.

* * * * *